(12) United States Patent
Damiano, Jr. et al.

(10) Patent No.: US 9,275,826 B2
(45) Date of Patent: *Mar. 1, 2016

(54) MICROSCOPY SUPPORT STRUCTURES

(71) Applicant: PROTOCHIPS, INC., Raleigh, NC (US)

(72) Inventors: John Damiano, Jr., Apex, NC (US); Stephen E. Mick, Weimar, TX (US); David P. Nackashi, Raleigh, NC (US)

(73) Assignee: PROTOCHIPS, INC., Morrisville, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/525,894

(22) Filed: Oct. 28, 2014

(65) Prior Publication Data
US 2015/0179397 A1 Jun. 25, 2015

Related U.S. Application Data

(62) Division of application No. 12/599,339, filed as application No. PCT/US2008/063200 on May 9, 2008, now Pat. No. 8,872,129.

(60) Provisional application No. 60/974,384, filed on Sep. 21, 2007, provisional application No. 60/916,916, filed on May 9, 2007.

(51) Int. Cl.
*H01J 37/20* (2006.01)
*H01J 37/26* (2006.01)

(52) U.S. Cl.
CPC ............... *H01J 37/20* (2013.01); *H01J 37/26* (2013.01); *H01J 37/261* (2013.01);
(Continued)

(58) Field of Classification Search
CPC ........ H01J 37/20; H01J 37/26; H01J 2237/20; H01J 2237/2001; H01J 2237/2002; H01J 2237/2003; H01J 2237/2065
IPC .............................................. H01J 37/20, 37/26
See application file for complete search history.

(56) References Cited

U.S. PATENT DOCUMENTS 5,260,151 A 11/1993 Berger et al.
5,296,255 A 3/1994 Gland et al.
(Continued)

FOREIGN PATENT DOCUMENTS

DE 202006013471 U1 11/2006
JP 57095762 U 6/1982
(Continued)

OTHER PUBLICATIONS

Olson, Eric A., et al; "The Design and Operation of a MEMS Differential Scanning Nanocalorimeter for High-Speed Heat Capacity Measurements of Ultrathin Films," Journal of Microelectromechanical Systems, 2003, pp. 355-364 vol. 12.
(Continued)

*Primary Examiner* — Robert Kim
*Assistant Examiner* — Eliza Osenbaugh-Stewar
(74) *Attorney, Agent, or Firm* — Tristan A. Fuierer; Moore & Van Allen, PLLC

(57) ABSTRACT

Electron microscope support structures and methods of making and using same. The support structures are generally constructed using semiconductor materials and semiconductor manufacturing processes. The temperature of the support structure may be controlled and/or gases or liquids may be confined in the observation region for reactions and/or imaging.

22 Claims, 25 Drawing Sheets

(52) U.S. Cl.
CPC ... *H01J 2237/188* (2013.01); *H01J 2237/2001* (2013.01); *H01J 2237/2002* (2013.01); *H01J 2237/2003* (2013.01); *H01J 2237/2007* (2013.01); *H01J 2237/2008* (2013.01); *H01J 2237/28* (2013.01); *H01J 2237/2802* (2013.01)

(56) References Cited

U.S. PATENT DOCUMENTS

| | | | |
|---|---|---|---|
| 5,367,171 | A | 11/1994 | Aoyama et al. |
| 5,714,791 | A | 2/1998 | Chi et al. |
| 5,731,587 | A | 3/1998 | DiBattista et al. |
| 6,297,511 | B1 | 10/2001 | Syllaios et al. |
| 6,768,124 | B2 | 7/2004 | Suzuki et al. |
| 6,786,716 | B1 | 9/2004 | Gardner et al. |
| 6,812,473 | B1 | 11/2004 | Amemiya |
| 7,482,587 | B1 | 1/2009 | Finch |
| 8,872,129 | B2 * | 10/2014 | Damiano et al. ........... 250/443.1 |
| 2006/0011834 | A1 | 1/2006 | Nishimura et al. |
| 2006/0025002 | A1 | 2/2006 | Zhang et al. |
| 2006/0102850 | A1 | 5/2006 | Tokunaga et al. |
| 2006/0272383 | A1 * | 12/2006 | Huang et al. .................... 73/1.15 |
| 2008/0179518 | A1 * | 7/2008 | Creemer et al. ............. 250/311 |

FOREIGN PATENT DOCUMENTS

| | | |
|---|---|---|
| JP | 05325859 | 12/1993 |
| JP | 2001077013 A | 3/2001 |
| JP | 2004045359 A | 2/2004 |
| JP | 2005114534 A | 4/2005 |
| JP | 2006203040 A | 8/2006 |
| JP | 2008512841 A | 4/2008 |
| WO | 2006031104 A1 | 3/2006 |

OTHER PUBLICATIONS

Supplementary European Search Report, Jan. 31, 2012.
Japanese Office Action, Jan. 17, 2013.
International Preliminary Report on Patentability, Nov. 10, 2009.
Butler, E.P., et al.; "Dynamic Experiments in the Electron Microscope," Practical Methods in Electron Microscopy, 1981, pp. 109-355, vol. 9.
Sharma, Renu, et al.; "Development of a TEM to Study in Situ Structural and Chemical Changes at an Atomic Level During Gas-Solid Interactions at Elevated Temperatures," Microscopy Research and Technique, 1998, pp. 270-280, vol. 42.
Zhang, M., et al.; "In situ transmission electron microscopy studies enabled by mircoelectromechanical system technology," Journal of Materials Research, 2005, pp. 1802-1807, vol. 20.
European Office Action, Aug. 29, 2013.
Japanese Office Action, Jan. 13, 2015.
European Supplementary Search Report dated Aug. 17, 2015.
Brand, et al., Electron Devices Meeting, Technical Digest, IEEE, Dec. 5, 1993, pp. 195-198.
Paul, et al., Sensors and Actuators A 46-47, 1995, pp. 143-146.
Baltes, et al., Proceedings of the IEEE, vol. 86, No. 8, Aug. 1998, pp. 1660-1678.

* cited by examiner

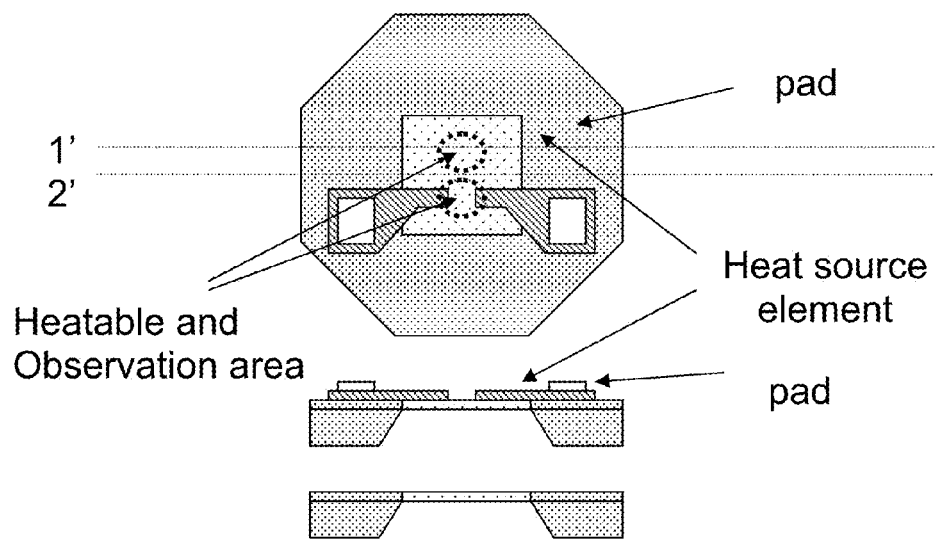
Fig. 5A
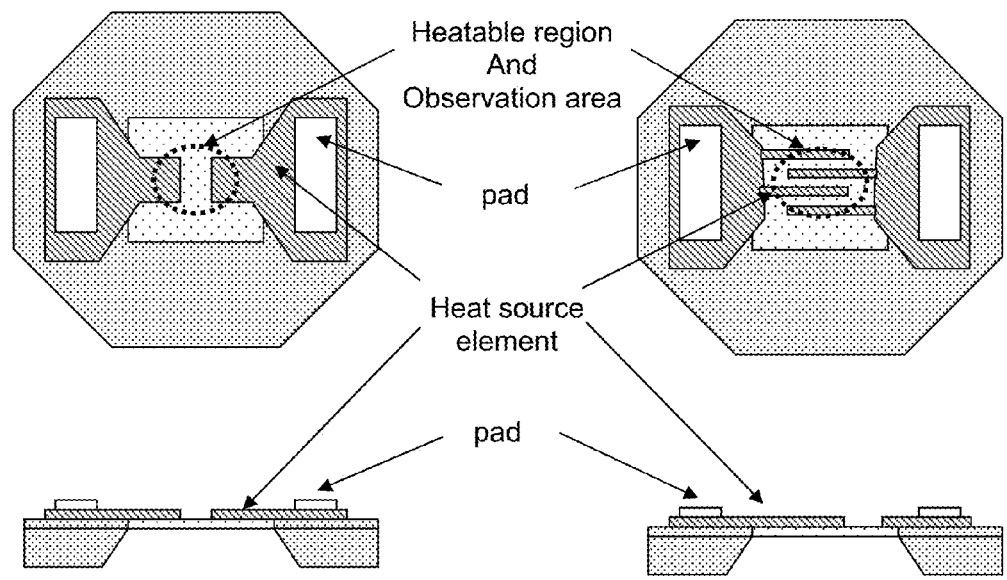
Fig. 5B
Fig. 5C

MICROSCOPY SUPPORT STRUCTURES

FIELD

The present invention relates generally to support devices to confine gases and/or liquids and/or control the temperature of a specimen for electron microscopy. Said devices contain at least a membrane region and a frame region and are generally constructed using semiconductor materials and semiconductor manufacturing processes.

BACKGROUND

Transmission Electron Microscopy, or TEM, technology enables materials to be analyzed at near atomic resolution by providing high magnification, high resolution imaging and analysis capabilities. TEM enables scientists to gather information relating to a material's physical properties such as its microstructure, crystalline orientation and elemental composition. This information has become increasingly important as the need for advanced materials for use in areas such as microelectronics and optoelectronics, biomedical technology, aerospace, transportation systems and alternative energy sources, among others, increases.

TEM is accomplished by examining material specimens under a transmission electron microscope. In a transmission electron microscope, a series of electro-magnetic lenses direct and focus an accelerated beam of electrons, emitted from an electron gun contained within the microscope, at the surface of a specimen. Electrons transmitted through the specimen yield an image of the specimen's structure which provides information regarding its properties. In addition, elemental and chemical information is provided by both the transmitted electrons and the x-rays that are emitted from the specimen's surface as a result of electron interaction with the specimen. It is necessary for the electron beam to transmit not only through the specimen but also the specimen support, which must mechanically support the specimen itself.

Of particular interest is the imaging of specimens in environmental cells, e.g., exposed to certain physical or chemical conditions such as increased temperature and/or gases and/or liquids at the observation region.

SUMMARY

In one aspect, a device is described wherein said device comprises a membrane comprising at least one membrane region; and at least one conductive element in contact with the membrane forming a heatable region of the membrane.

In another aspect, a device is described wherein said device comprises a membrane comprising at least one membrane region; and at least one mechanical support element.

In still another aspect, an environmental cell is described comprises a device configured to permit control of heating of a specimen on the device; and one or more other environmental conditions of the specimen on the device, wherein said device comprises a membrane comprising at least one membrane region; and at least one conductive element in contact with the membrane forming a heatable region of the membrane.

In yet another aspect, an environmental cell is described comprises a device configured to permit control of heating of a specimen on the device; and one or more other environmental conditions of the specimen on the device, wherein said device comprises a membrane comprising at least one membrane region; and at least one mechanical support element.

Still another aspect includes methods of making and using a device, wherein said device comprises a membrane comprising at least one membrane region; and at least one conductive element in contact with the membrane forming a heatable region of the membrane.

Yet another aspect includes methods of making and using a device, wherein said device comprises a membrane comprising at least one membrane region; and at least one mechanical support element.

Other aspects, features and advantages of the invention will be more fully apparent from the ensuing disclosure and appended claims.

BRIEF DESCRIPTION OF THE DRAWINGS

FIG. 5A illustrates a device described herein with two heatable and observation regions on the same membrane, in plan view and cross-sectional view.

FIG. 5B illustrates heat source elements designed as a simple polygon, in plan view and cross-sectional view FIG. 5C illustrates heat source elements as a complex structure with multiple fingers interdigitated with one or more other heat source elements, in plan view and cross-sectional view.

FIG. 11 illustrates the device substrate 110 in plan view and cross-sectional view.

FIG. 12 illustrates the bilayer device structure after deposition of electrically insulating layer 120, high-resistivity semiconductor or ceramic material 130, low-resistivity semiconductor or ceramic material 140, and hard mask material 150, in plan view and cross-sectional view.

FIG. 13 illustrates the bilayer device structure after formation of the device frame region 160 in plan view and cross-sectional view. The device frame region 160 is formed by patterning hard mask material 150.

FIG. 14 illustrates the bilayer device structure after formation of electrodes 170 in plan view and cross-sectional view. Electrodes 170 are formed by patterning low-resistivity semiconductor or ceramic material 140.

FIG. 15 illustrates the bilayer device structure after formation of hole features 180 in plan view and cross-sectional view. Hole features 180 are formed by patterning high-resistivity semiconductor or ceramic material 130 and electrically insulating material 120.

FIG. 16 illustrates the bilayer device structure after formation of contact pads 200, in plan view and cross-sectional view. Contact pads are formed by deposition of contact metal layer 190 followed by lithographic and etch processes. Contact pads 200 are typically fully enclosed by low-resistivity semiconductor or ceramic material 140, forming the surface of the electrodes 170.

FIG. 17 illustrates the bilayer device structure after formation of the membrane region 210. The membrane region 210 is formed by removing areas of the substrate 110 not covered by hard mask material 150. Areas of the substrate covered by hard mask material 150 are not etched, and thus form the device frame region 160.

FIG. 18 illustrates the device substrate 300 in plan view and cross-sectional view.

FIG. 19 illustrates the metal electrode device structure after deposition of electrically insulating layer 310, high-resistivity semiconductor or ceramic material 320, and hard mask material 330, in plan view and cross-sectional view.

FIG. 20 illustrates the metal electrode device structure after formation of the device frame region 340 in plan view and cross-sectional view. The device frame region is formed by patterning hard mask material 330.

FIG. 21 illustrates the metal electrode device structure after formation of hole features 350 in plan view and cross-sectional view. Hole features 350 are formed by patterning high-resistivity semiconductor or ceramic material 320 and electrically insulating material 310.

FIG. 22 illustrates the metal electrode device structure after deposition of refractory metal layer 360 and formation of refractory metal regions 370 in plan view and cross-sectional view. Refractory metal regions 370 are comprised of heat source elements 380 and contact pads 390.

FIG. 23 illustrates the metal electrode device structure after formation of the membrane region 400 in plan view and cross-sectional view. The membrane region 400 is formed by removing areas of the substrate 300 not covered by hard mask material 330. Areas of the substrate covered by hard mask material 330 are not etched, and thus form the device frame region 340.

DETAILED DESCRIPTION

Figure 1:
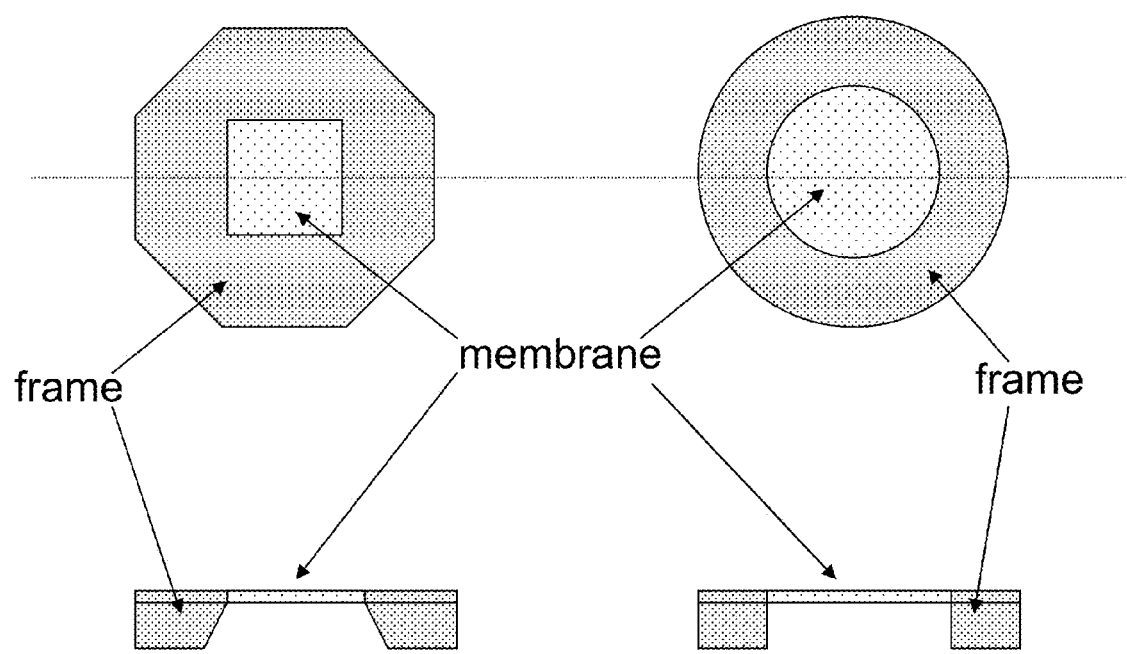
FIG. 1 illustrates the membrane region and frame region of an embodiment of a device described herein in plan view and cross-sectional view.

The present invention relates generally to devices to confine gases and/or liquids and/or control the temperature of a specimen. Devices are generally constructed using semiconductor materials, and contain at least a membrane region and a frame region. Devices are placed at the specimen tip region of the holder.

As defined herein, "coupled," with reference to coupling of one electrical component to another, indicates an electrical relationship between two or more components. The fact that one component is said to be electronically coupled to a second component is not intended to exclude the possibility that additional components may be present between, and/or operatively associated or engaged with, the coupled components.

As defined herein, "flanked," when used in reference to electrically conductive components of the system means that the flanking components are generally arranged on either side of the flanked structure and electronically coupled to the flanked component. The fact that one component is said to be flanked by flanking components is not intended to exclude the possibility that additional components may be present between, and/or operatively associated or engaged with, the flanked component and the flanking components. Moreover, flanking elements may overlap the flanked component or may be manufactured in a manner which makes them integral with the flanked component.

As defined herein, "semiconductor" means a material, such as silicon, that is intermediate in electrical conductivity between conductors and insulators.

As defined herein, "device" means a structure used to either contain gases and/or control temperatures around a specimen and includes, but is not limited to, a window device and a temperature control device.

As defined herein, "specimen" means the object being studied in the electron microscope, typically placed within or on the device in the region of temperature and/or gas control which is at least partially electron transparent (e.g., nanoparticle, catalyst, thin section, etc.).

As defined herein, "E-cell" means a system for containing and controlling an environment around a specimen (e.g., 1 device, 2 device or 3+ device systems).

As defined herein, "holder" means a precision-machined piece of equipment used to hold and secure one or more devices either individually, as a collection, or arranged as an E-cell, and to provide an interface between the device(s) and/or E-cell and the outside world.

As defined herein, "window device" means a device used to create a physical, electron transparent barrier on one boundary of the E-cell and the vacuum environment of the electron microscope and is generally a silicon nitride-based semiconductor micro-machined part, although other semiconductor materials are contemplated.

As defined herein, "temperature control device" means a device used to control the temperature around the specimen either individually or within an E-cell and is generally a silicon carbide-based semiconductor micro-machined part, although other semiconductor materials are contemplated.

As defined herein, "frame" means a rigid region around the perimeter of a device that is used to provide mechanical support to the entire device structure. Preferred embodiments include a silicon frame selectively etched using KOH, a silicon frame selectively etched using reactive ion etching (RIE), a silicon frame selectively etched using deep reactive ion etching (DRIE), or a silicon frame released from an silicon-on-insulator (SOI) wafer.

As defined herein, "membrane region" means a region generally in the center of each device that is unsupported by the frame (e.g., in a window device the membrane region may be a thin, amorphous silicon nitride film that is electron transparent; in a temperature control device the membrane region may be a thin, silicon carbide film that might or might not be electron transparent, but provides a surface upon which a specimen can be placed and the temperature controlled. In a temperature control device the membrane region may be a thin, amorphous carbon film deposited on top of a silicon carbide film.

As defined herein, "element" means a component used on a device, typically on or near the membrane, that enhances or adds capability to the device (e.g., heat source element, mechanical element, heat sink element, or combinations thereof).

As defined herein, "mechanical element" means a component generally used to strengthen and provide rigidity to the membrane (e.g., reinforced membrane embodiment).

As defined herein, "heat source element" means a component made up of two or more electrodes through which a current is forced, creating heat through Joule heating. In a temperature control device a heat source element may be used to effect direct heating—the membrane is the heat source element directly heating the specimen (bilayer stack). Alternatively in a temperature control device a heat source element may be used to effect indirect heating—flux carries the heat across the membrane to the specimen. Many different spatial designs exist.

As defined herein, "heat sink element" means a component made up of one or more electrodes used to passively remove heat from the membrane region by providing path(s) for higher flux to occur away from the membrane.

As defined herein, "temperature sense element" means a component used to directly measure the temperature on the device (e.g., window device and/or temperature control device) and may be either frame or membrane components, but typically membrane.

As defined herein, "electrical sense element" means a component used to directly measure current or voltage on the device (e.g., temperature control device) and may be either frame or membrane, but typically membrane.

As defined herein, "mechanical sense element" means a component used to measure deflection or rupture of a membrane on the device (e.g., window device and/or temperature control device).

As defined herein, "electrode" means a component or an element used to facilitate heat or electrical flux on a device, wherein the electrode corresponds to thicker regions on the membrane, that span out over the frame, and are typically part of an element.

As defined herein, "pad" means an area on an electrode used to provide an interface between the holder and the device.

As defined herein, "refractory metals" correspond to tungsten, niobium, tantalum, molybdenum, rhenium, osmium, iridium, rhodium, ruthenium, technetium, hafnium, zirconium, vanadium, chromium, platinum, palladium and alloys thereof.

When a given component such as a layer, region or substrate is referred to herein as being disposed or formed "on" another component, that given component can be directly on the other component or, alternatively, intervening components (for example, one or more coatings, layers, interlayers) can also be present. It will be further understood that the term "layered on" is used to describe how a given component is positioned or situated in relation to another component and is not intended to introduce any limitations relating to particular methods of material transport, deposition, or fabrication.

When a specimen is described as being "on" a structure, such as a specimen platform, such specimen could be either in direct contact with the structure, or could be in contact with one or more layers or films that are interposed between the specimen and structure.

A device of the invention is generally constructed using semiconductor materials, and contains at least a frame and one membrane region. It may also contain a frame and multiple membrane regions. The preferred devices are one frame and one membrane and one frame and 2, 3 or 4 membranes. A device may or may not include one or more additional elements, such as heat source elements and mechanical elements. These elements are used to add additional capabilities to the device itself and are used to differentiate different types of devices for specific applications. Devices are placed at the specimen tip region of the holder.

A membrane region is a portion of the device structure generally in the center of each device that is unsupported by the frame. The membrane region may consist of one or more thin films, including semiconductor materials as well as other deposited films such as carbon or graphene. Membrane regions are generally less than 1 micron in thickness, but do not have to be a uniform thickness. They can serve to either create a physical barrier between the environment at the specimen and the environment within the electron microscope, or as a support upon which to place the specimen, or both. One or more membrane regions may be located on a device, and are generally separated by a thicker demarcating region between them, wherein the demarcating region is above, below and/or beside the membrane region. Membrane regions may be either continuous or have perforations in any shape or size. A device with membrane and frame regions specified is illustrated in FIG. 1.

The membrane region(s) in each device are created from membrane materials, are generally less than 1 micron in thickness, are robust, insulating or conductive, and can be constructed using a variety of semiconductor manufacturing techniques in combination with other deposition and float-down techniques. In general, membrane materials are deposited onto the frame material and have a tensile stress profile to keep the subsequently formed membrane region(s) pulled tightly across the frame. One embodiment of a membrane region is a thin, amorphous silicon nitride film as the membrane material so that the membrane region is nearly electron transparent, and another embodiment of a membrane region is a thin, silicon carbide film as the membrane material. In this embodiment the membrane region is not required to be electron transparent although it can be electron transparent or partially electron transparent. In this embodiment the membrane material provides a surface upon which a specimen can be placed and the temperature controlled. Other membrane materials that can be used to create membrane regions include boron nitride, graphene, carbon, aluminum nitride, silicon dioxide and silicon. Membrane regions may or may not contain additional elements directly integrated onto or placed upon their top or bottom surface. When a membrane region is constructed from a conductive material, a thin insulating material such as silicon dioxide or silicon nitride may be placed between the frame and the material on the frame that is contiguous with the membrane region to prevent the creation of a shorting electrical path through the frame. Likewise, when a membrane region is constructed from a conductive material, a thin insulating material such as silicon dioxide or silicon nitride may be deposited or placed on the top or bottom surface of the membrane material to prevent the creation of a shorting electrical path.

A membrane region may either be comprised of a continuous film of membrane material or may be comprised of a stack of films or membrane materials, or may contain one or more holes perforating the membrane material from the top to the bottom surface, or may contain one or more dimples in its top or bottom surface. Holes perforating the membrane region are generally less than 10 microns across, but can be as large as hundreds of microns. Holes are generally circular in shape, but may also be squares, diamonds, rectangles, triangular or polygonal. Holes are generally used to create regions in a membrane region that are completely electron transparent, upon which a specimen is placed. Dimples in the membrane material within the membrane region are generally less than 100 microns across, but can be as large as hundreds of microns. Dimples are generally circular in shape, but may also be squares, diamonds, rectangles, triangular or polygonal. Dimples are generally used to create regions in a membrane region that are relatively more electron transparent than the non-dimpled membrane regions.

Membranes regions within devices that are used to control a specimen temperature will have a distinct heatable region within the membrane region that is generally in the center of the membrane region, and is the area where the specimen temperature is primarily controlled. This heatable region is defined by the heat generated using the heat source element. More than one heatable region may be present upon each membrane region. A key differentiating feature of the devices described herein over other approaches is the membrane region itself being used as both the specimen support as well as the heatable region (i.e., the source of heat). This approach minimizes the distance between the specimen and the heatable region, allowing the sample to be in very close proximity (less than 500 nm) from the heat source. This greatly reduces the temperature ambiguity present in other systems that generate the heat in regions away from the specimen and rely solely on heat flux through materials with poor heat conductivity to heat the specimen indirectly.

A membrane observation region is the location on the membrane region where the electron beam can be used to analyze a specimen, and is generally the location where the specimen is placed. This observation region is typically the same as the size and shape of the entire membrane region itself, but in some instances may be considered as only the heatable region or as a subset of the membrane region.

A membrane region can be composed of one or more layers of thin film membrane materials, generally resulting in a cumulative tensile stress profile. In the case of film stacks, either different membrane materials can be deposited upon one another, or the same membrane material with differing material properties (such as doping levels) may also be used. One embodiment is a homogenous silicon nitride film used as the membrane material; another embodiment is a stack of multiple silicon carbide films with different doping levels as a stack of membrane materials; and a third is a metal deposited on top of a silicon carbide film as a stack of membrane materials.

Membrane regions may contain additional elements that serve to provide mechanical stability to the membrane itself, to provide a mechanical source or sense element to the specimen or membrane region, to provide an electrical source or sense element to the specimen or membrane region, to provide a temperature source or sense element to the specimen or membrane region, to provide a pressure sense element to the specimen or membrane region, to provide a chemical sense element to the specimen or membrane region, and/or to provide a means to calibrate the electron microscope.

Figure 2:
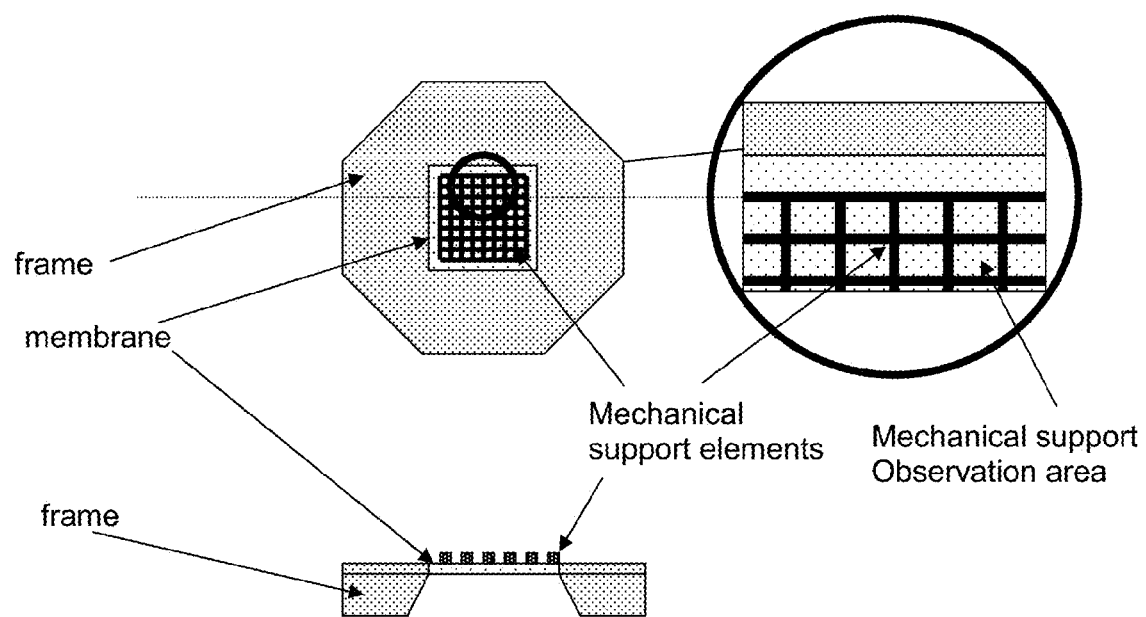
FIG. 2 illustrates the mechanical support elements of a device described herein in plan view and cross-sectional view.

A mechanical support element is generally used to provide additional physical support to the membrane region itself, allowing for very thin regions to be created in the membrane region and enhancing the performance of the overall device. The mechanical support elements are a region or regions within the membrane region that are used to provide local strength for the purpose of forming an overall membrane region that is robust to mechanical forces yet contain subregions that minimize electron beam scattering. The mechanical support elements may be constructed by forming localized areas on the surface of the membrane region that are thicker than the rest of the membrane region by standard material deposition techniques. The mechanical support elements may also be constructed by forming localized areas on the surface of the membrane region that are thinner than the rest of the membrane region by standard material etching techniques. Mechanical support elements are illustrated in FIG. 2.

The mechanical support elements may be comprised of the same membrane material as the membrane region, or a different material than the membrane region. Materials for the mechanical support element(s) include semiconductors, metals and/or insulators, including silicon nitride, silicon, silicon carbide, silicon dioxide, copper, titanium, aluminum, gold, platinum, palladium, brass, tungsten and other non-magnetic alloys. The additional stress added to the membrane by the mechanical element will still result in a cumulative tensile stress profile. Mechanical elements are generally less than 5 microns thick.

The region on the membrane region where the mechanical support exists is considered the support region. If the total thickness of the support region and the membrane region is less than 1 micron and sufficiently electron transparent, it may be considered both a mechanical support and membrane observation region. Mechanical supports can be isolated features such as rectangles or squares that are patterned in the membrane material either on or off the membrane region, they can be continuous features such as screens or grids patterned in the membrane material either on or off the membrane region, they can be isolated features such as rectangles or squares that are patterned in material deposited and/or placed on top of the membrane material either on or off the membrane region, or they can be continuous features such as screens or grids that are patterned in material either deposited and/or placed on top of the membrane material either on or off the membrane region.

The regions in between the mechanical support regions are considered the observation regions through which to image the specimen. These observation regions are generally the thinnest regions of membrane region, whose overall strength is increased as a result of the mechanical support regions. These observation regions are generally square in shape, but may also be circular, rectangular, hexagonal, triangular or polygonal. The mechanical support observation area is illustrated in FIG. 2.

Figure 3:
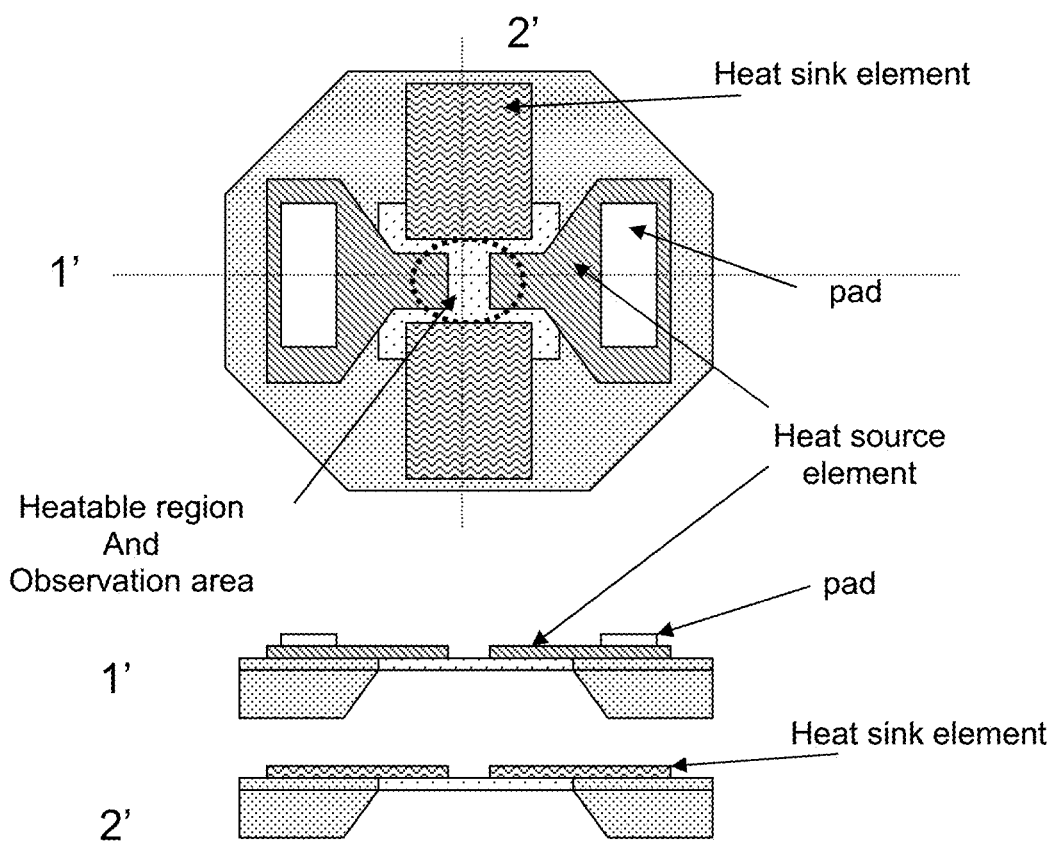
FIG. 3 illustrates the heat sink and heat source elements, heatable region, observation area, and pad region of a device described herein in plan view and cross-sectional view.

In devices used to control the temperature of a specimen, heat is generated using an element on the membrane. To provide temperature stability and maintain temperature uniformity, heat sink elements are used to create additional heat flux paths from the heat source element away from the membrane region, particularly when the specimen is exposed to the vacuum environment of the electron microscope which precludes heat convection as an alternative pathway. Heat sink elements are generally placed on a membrane region when temperatures in excess of 800 degrees Celsius are expected and thermal, mechanical, or electrical instability is possible based on the design of the membrane region and any elements present on the device. Heat sink elements are used in or near the heatable region to facilitate heat transfer out of the heatable region. These features could help stabilize the temperature, allow for higher temperatures in the heatable regions, and allow for more rapid cooling of the device. An element can be used to provide a dual purpose, such as to act as a heat sink element as well as a mechanical support. Heat sink elements are illustrated in FIG. 3.

Heat sinks are constructed as elements on the surface of the membrane, and are comprised of a material or materials that have a high thermal conductivity, such as silicon carbide, silicon or non-magnetic metals such as tungsten, platinum, gold, titanium, palladium or copper and non-magnetic alloys. The heat sink elements are either thicker regions patterned on the surface of the membrane region, made from the same material, or a different material altogether. Preferred embodiments include 1) thicker regions of silicon carbide patterned directly on the membrane region, and 2) the deposition and patterning of a metal such as tungsten on top of the membrane region.

The heat sink regions are the areas on the membrane region that contain heat sink elements. The heat sink elements are generally rectangular, although other shapes are contemplated including square, triangular, elliptical, trapezoidal and polygonal and said elements may be symmetrical or asymmetrical, and are located so as to be both on the surface of the membrane and off the membrane itself, to provide a heat flux path from the heatable region onto the frame. One or more heat flux elements may be present on a device, and generally they are patterned in widths from about 2 microns up to about 500 microns, and at lengths from about 50 microns to about 1.5 millimeters. Heat sink elements are generally placed in flanking positions on the membrane, in a symmetrical pattern although asymmetrical placement is contemplated. The regions in between the heat sink regions are considered the observation areas through which to image the specimen. These are generally the thinnest regions of membrane region.

When devices contain multiple membrane regions with one or more heatable regions, heat sink structures can be used to control the dissipation of heat such that nearby (adjacent) membrane regions are thermally isolated. Heat sink structures could be used to pull heat away from specimens on membrane regions under test in specific directions along cooling fingers to further assist in thermal isolation.

It is known that heat convection from the membrane region into the area above and below the surface of the membrane region is virtually nonexistent in a vacuum, and heat sink structures can be used to define a specific thermal gradient to achieve more temperature stability.

Figures 4A, 4B:
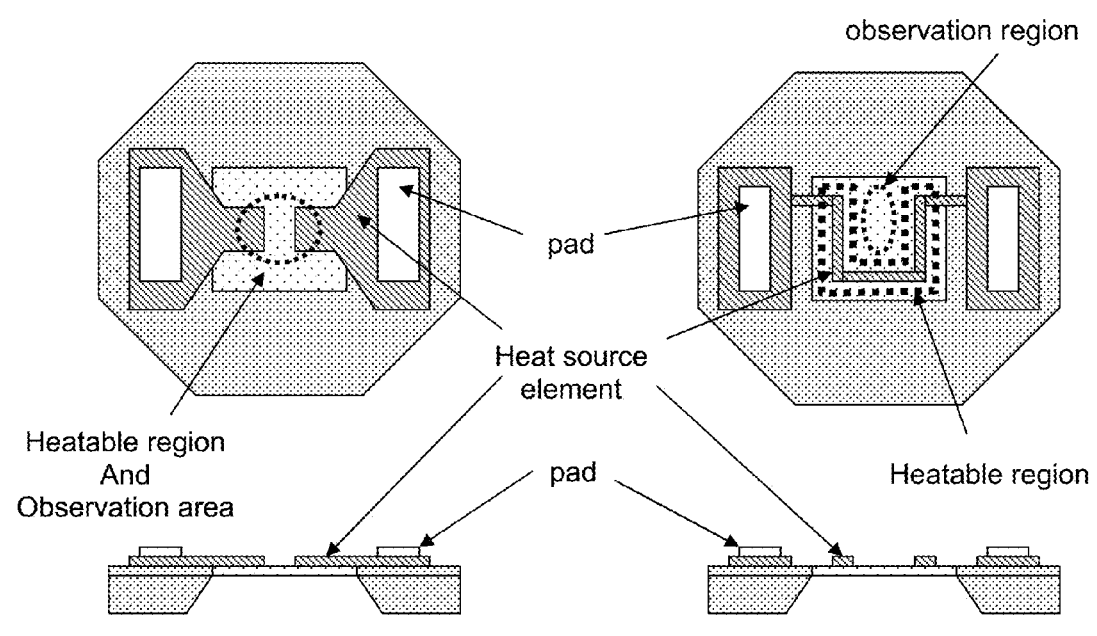
FIG. 4A, illustrates the heat source element of a device described herein in plan view and cross-sectional view, wherein direct heating is applied, and the heatable region and observation region are identical.
FIG. 4B, illustrates the heat source element of a device described herein in plan view and cross-sectional view, wherein indirect heating is applied, and the observation region is adjacent to the heatable region.
Figure 6:
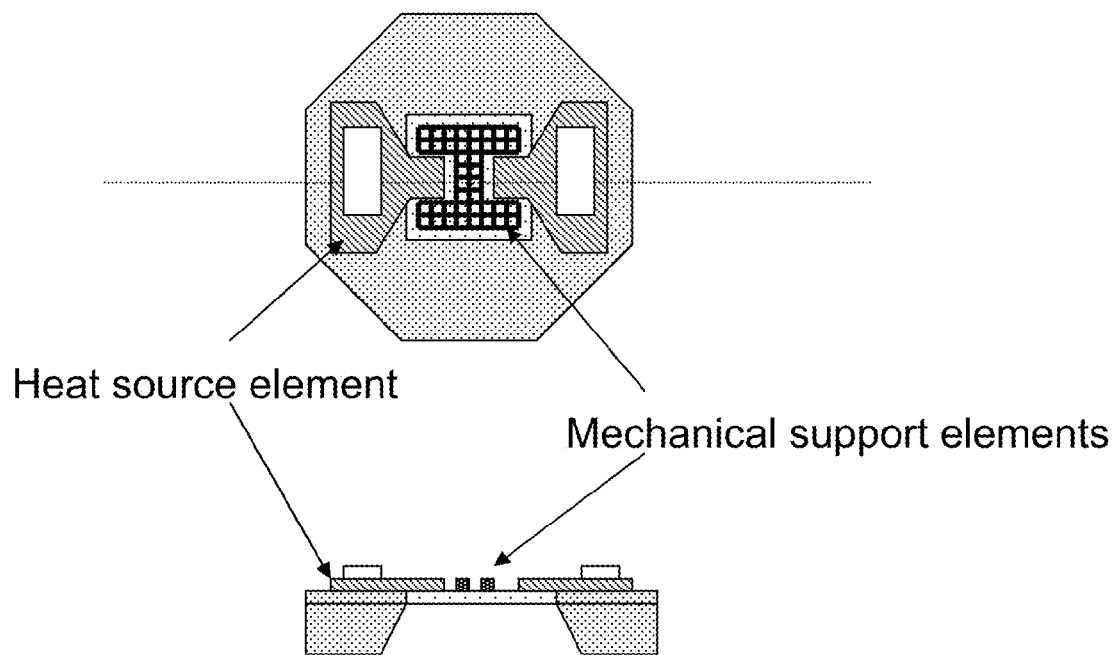
FIG. 6 illustrates the use of both heat source elements and mechanical support elements on a device described herein in plan view and cross-sectional view.

Heat source elements are comprised of electrodes of sufficiently high conductivity to allow current flow for Joule heating at voltages generally less than 200V. Heat source elements are generally fabricated or placed above the frame material and are generally created from either the membrane material(s), a combination of the membrane material(s) plus subsequent material(s) deposited, grown or placed on top of the membrane material(s), or material(s) deposited, grown or placed on top of the membrane material. The presence of two or more heat source elements defines at least one heatable region on the membrane region. The heat source element(s) can extend onto the membrane region. In the case of direct heating, the heatable region and the observation region are the same. In the case of indirect heating, the observation region(s) are separate regions from the heatable region(s). Heat source elements may occupy a large area on the frame and an electrical pad may be used to facilitate electrical contact between the heat source element and the electron microscope holder. The heat source element may be more narrow near the membrane region so as to confine the electrical current path and to facilitate Joule heating across the membrane region. A preferred embodiment for direct heating is to place two heat source elements in a flanking position across the membrane region, with an observation region defined between them. The observation region is also the heating region, which is an area on the membrane region located between (and not including) the heat source elements. Heat source elements are illustrated in FIGS. 4 and 5. Heat source elements with mechanical supports are illustrated in FIG. 6. The use of a membrane material that is at least partially conductive allows Joule heating to occur within the membrane, specifically, in the observation region that is supporting the specimen. This makes the membrane observation region itself the heatable region, and is a key differentiating feature of the devices described herein over other approaches. Directly heating the membrane (which supports the specimen) by forcing current through the material using heat source elements minimizes the distance between the heatable region and the specimen, generally to distances less than about 500 nm. This removes the ambiguity between knowing the temperature of the heater and temperature of the sample.

Heat source elements are generally deposited and patterned on the surface of the device, and are located both on the frame and the membrane. They are manufactured using a material that is highly conductive. Preferred materials for manufacturing heat source elements are silicon carbide and refractory metals.

One preferred embodiment is to manufacture the membrane region using a stack of material with different electrical conductivities such as multiple layers of silicon carbide with different doping profiles in each adjacent layer, and define two or more heat source elements by patterning the membrane material stack. The membrane material(s) may vary in conductivity with thickness, generally from less conductive in the material closest to the frame to more conductive in the material furthest from the frame. Another embodiment is to manufacture the membrane region using a conductive material such as silicon carbide, and then deposit and pattern two or more heat source elements in a more conductive material such as a refractory metal deposited, placed, or grown above the membrane material. In both of these embodiments, when current is forced from one or more heat source elements to one or more other heat source elements through the membrane material, Joule heating will occur in the membrane material. The heat source elements may be designed in a variety of ways to selectively expose areas in the membrane region that are less conductive than the heat source elements. For example, the size and shape of each heat source element, the spatial relationship between the heat source element(s) and the membrane region(s), and the distance between heat source elements can all be designed to control the uniformity of heat on the membrane region and the localization of heat between adjacent membrane regions. Heat source elements may be designed as a simple polygon, as shown in FIG. 5B, or as a complex structure with multiple fingers interdigitated with one or more other heat source elements, as shown in FIG. 5C. Preferably, the current to the heatable region results in a uniform temperature change of at least about 1000 K in at least about 100 milliseconds, more preferably at least about 1000 K in about 50 milliseconds, even more preferably at least about 1000 K in about 25 milliseconds, and most preferably at least about 1000 K in at least about 15 milliseconds. In an alternate embodiment, the current to the heatable region results in a uniform temperature change of at least about 1500 K in at least about 100 milliseconds, more preferably at least about 1500 K in about 50 milliseconds, even more preferably at least about 1500 K in about 25 milliseconds, and most preferably at least about 1500 K in at least about 15 milliseconds. In still another alternate embodiment, the current to the heatable region results in a uniform temperature change of at least about 2000 K in at least about 100 milliseconds, more preferably at least about 2000 K in about 50 milliseconds, even more preferably at least about 2000 K in about 25 milliseconds, and most preferably at least about 2000 K in about 15 milliseconds.

The heat source heatable region is the region on the membrane where the majority of the heating occurs. The heat source observation area is an area on the membrane region where the specimen is placed to facilitate observation using an electron microscope, and it is a region whose temperature is controlled using a heat source element(s). In direct heating, the heat source observation area is the area of the membrane region between two or more heat source elements, and this area is both the heat source observation area and the heatable region, heated by Joule heating from current flowing between the heat source elements. In indirect heating, the heat source element is the heat source heatable region and the heat source observation region is located nearby being heated by heat generated in the heatable region and transferred by thermal conduction to the heat source observation region. Importantly, in indirect heating, the membrane is a thermal conductor, not an insulator. Moreover, the heaters use a semiconductor material as the heater and not spiral metal heaters as found in prior art devices.

A temperature sense element may be included on the devices described herein, wherein the temperature sense element is a patterned material located on the surface of the membrane region, typically on or near the observation region, used to directly measure the temperature of the observation region itself. Specimens are placed directly on the observation region, therefore, a temperature measurement in this region is an indication of the temperature of the specimen itself. Temperature sense elements may also be used to monitor the temperature in other areas on the device, such as in the heatable region if different that the observation region.

An embodiment of a temperature sense element is a wire or thermocouple that is patterned directly across the surface of the membrane in or near the observation region. Such an embodiment must be much more conductive than the membrane region itself, generally more than 100 times. An example of such a temperature sense element is a platinum resistance thermometer. Another embodiment of a temperature sense element is a feature comprised of a material with known physical, chemical, and/or electrical properties at a specified temperature where such properties may be monitored in situ during electron beam analysis and heating on the membrane region. An example of such a temperature sense element is a small patterned area comprised of an alloy with a phase change at a known temperature where the phase change of the temperature sense element could be monitored or observed and thereby the temperature on the membrane region would be known in close proximity to the temperature sense element.

An embodiment of a pressure sense element is a metal thin film resistor patterned directly across the surface of the membrane in the observation region that allows in situ detection of environmental pressure. As the observation region is deformed due to pressure and/or thermal expansion, the thin film resistor is deformed and its electrical resistance will change. From this change in electrical resistance, the pressure applied to the membrane can be calculated.

An embodiment of a chemical sense element is a thin film patterned directly on the surface of the membrane in or near the observation region that enables in situ detection of reactant gases. Thin films such as tin oxide display a change in conductance induced by the adsorption of gas molecules and their subsequent surface reactions. Another embodiment of a chemical sense element is a feature comprised of a material with known physical, chemical, and/or electrical properties upon exposure to a chemical where such properties may be monitored in situ during electron beam analysis and heating on the membrane region. An example of such a chemical sense element is a functionalized nanoparticle whereby a selective chemical reaction modifies the optical absorption of the nanoparticles, and the change in absorption of the chemical sense element could be monitored or observed.

Electrical contacts from the holder to the device are required for any element where an electrical signal is used to measure or stimulate some response of or on the device. Electrical contacts are generally used in conjunction with electrical source or sense elements. Electrical contacts are made by defining pad regions, and the pad regions are generally directly on the surface of the respective element itself and in a region over the frame. These pad regions are areas generally greater than about 100 microns by about 100 microns defined on the element either by 1) a patterned region of material where the pad material is different from the element material, or 2) a patterned region of the element where the pad region is comprised of the same material as the element material. The use of another material is preferred when a good and/or ohmic electrical contact cannot be achieved through a physical contact between the holder and the element material. If the element material is a metal such as tungsten, the pad region could simply be a large area within that element on the frame region. If the element material is a semiconductor or ceramic such as silicon carbide, a non-magnetic metal such as gold, tungsten, platinum, titanium, palladium or copper and non-magnetic alloys could be used. There may be multiple pads per element, and multiple elements per device.

Figure 7:
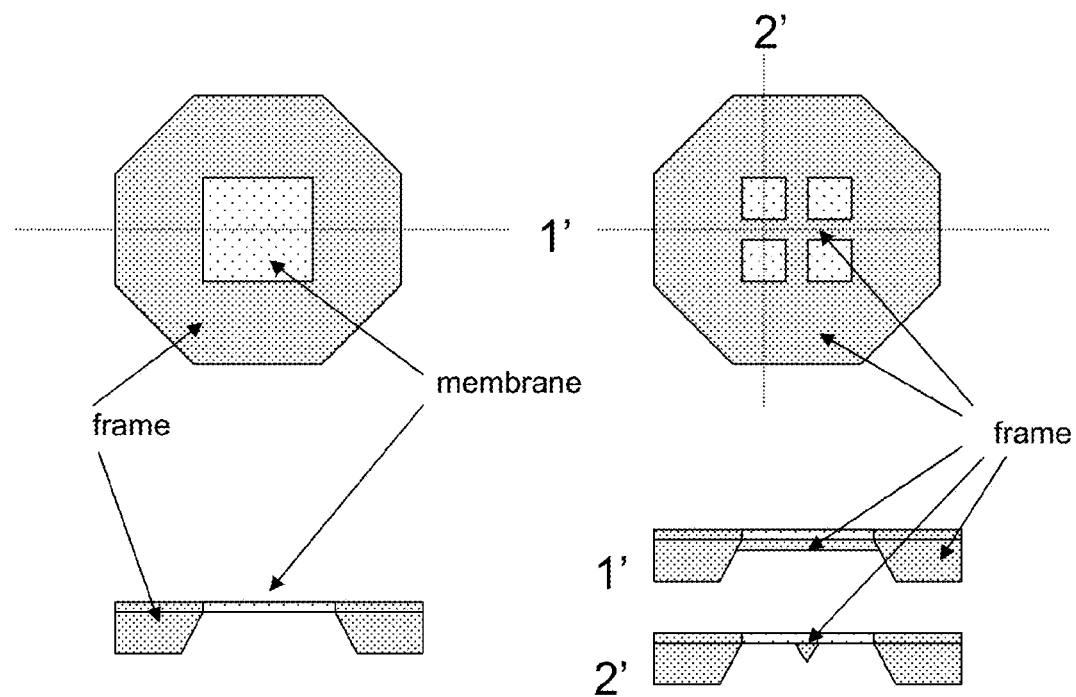
FIG. 7 illustrates two embodiments of frame design of the devices described herein in plan view and cross-sectional view.

Each device has a frame, which is a thick region generally around the perimeter of the device. The frame gives mechanical support to the device to allow for handling, and provides a strong surface to support the membrane region and allow for good contact between the device and the holder. It will also provide a level of thermal isolation between membrane regions on a device with multiple membrane regions. Frames are typically about 12 microns thick or greater, with preferred embodiments at about 12, 25, 50, 200 and 300 microns, or any variation in between, thick. The frame region is generally outside the observation region of the device. When multiple membranes are present on a device, the frame located between membranes may be thinner than the frame at the perimeter of the device. The frame region of a device is illustrated in FIG. 7. The preferred frame material is single crystal silicon, although frames may also be made from polysilicon, quartz or fused silica.

Frames may be circular, rectangular, square or polygonal at the perimeter. For rectangular or square frames, facets will generally be present at the corners. In devices with multiple membrane regions, the frame will also exist between the membrane regions to provide mechanical support as well as thermal isolation when used as a temperature control device. The membrane regions may also be square, rectangular, circular or polygonal. One preferred embodiment is to have a rectangular or square frame with one or more rectangular or square membrane regions near the center of the device. The frame at the perimeter would be slightly thicker than the frame that exists between the membrane regions. Another embodiment is a round frame at the perimeter, with either one or more round or square membrane regions. Two embodiments are shown in FIG. 7.

One aspect relates to a temperature control device, which is a device that contains at least one heat source element, and is used to control the temperature in a defined observation region on the membrane region. Multiple heat source elements may be present, allowing for multiple heatable regions and multiple observation regions. A temperature control device may also contain multiple heat source elements and multiple membrane regions. The frame regions between the multiple membranes will provide mechanical support to the membrane regions and thermal isolation between heatable and observation regions within the different membrane regions. The temperature control device may also contain additional elements to add capabilities, such as electrical sense, mechanical support and at least one heat sink.

Another aspect relates to a window device which contains a frame, a membrane region and may or may not contain mechanical elements. They are used to either support a specimen for imaging, or to confine an environment around a specimen in an environmental cell as described below.

The devices described herein provide the capability to achieve atomic resolution of a specimen in an electron microscope including a transmission electron microscope (TEM). Micron-scale openings formed in the membrane region provide electron beam-transparent regions for analysis and avoid any potential scattering from the membrane material comprising the membrane. Specimen preparation can be enhanced by the robustness of the device and membrane material, which allows for thorough cleaning before imaging to reduce or remove the background carbon peak in EELS. The robust nature of the device allows specimens to be directly deposited on the film in a furnace or even a chemical solution. This ability to withstand direct deposition of the specimen decreases specimen preparation time and increases resolution.

When a device as described herein is used in a chamber (external or within a microscope) that allows the control of gases and/or liquids at the observation region, it becomes part of an environmental cell. When multiple devices are stacked or positioned in a columnar arrangement, small areas or cells are created within voids between adjacent devices. These voids provide a space for gas and/or liquid to be confined and controlled, and provide an opportunity to further control the environment of a specimen placed on one or more of the devices. To prevent leaks, seals can be formed either using components such as washers on the devices themselves, or on the holder. These arrangements also form an environmental cell, or E-cell. Although E-cells may be used outside of an electron microscope, they are generally most useful when placed within an electron microscope to allow changes to the environment to take place while the impact of those changes are observed through imaging and/or analysis.

Environmental cells are generally constructed using either one or more window devices, one or more temperature control devices, or a combination of one or more window device(s) and temperature control device(s).

The devices described herein are mechanically and electrically mounted to a holder itself. In E-cells created from multiple, stacked devices, the holder may provide a method for sealing the environment between the devices or the sealing may occur between the devices themselves, not requiring this component from the holder. Importantly, the individual stacked devices of the E-cell are not intended to be bonded in any way to one another which differentiates devices described herein from prior art devices. When the holder is used to provide sealing of the environment, the portion of the holder to which the window device(s) mount may be retractable to a position outside of the path of the electron beam. This would allow the window device(s) to fully enclose the temperature control device during a reaction and be retracted afterwards. The retraction of the window device(s) outside of the path of the electron beam will remove scattering effects from those windows, and observation at the highest resolution possible. When multiple devices are used to create an E-cell, the membrane regions of the devices are typically aligned to provide a path for the electron beam and enable electron beam imaging. However, when a retractable mechanism is provided, the membrane regions may be aligned at times and out of alignment at other times depending upon the specific use of the E-cell.

Figure 8A:
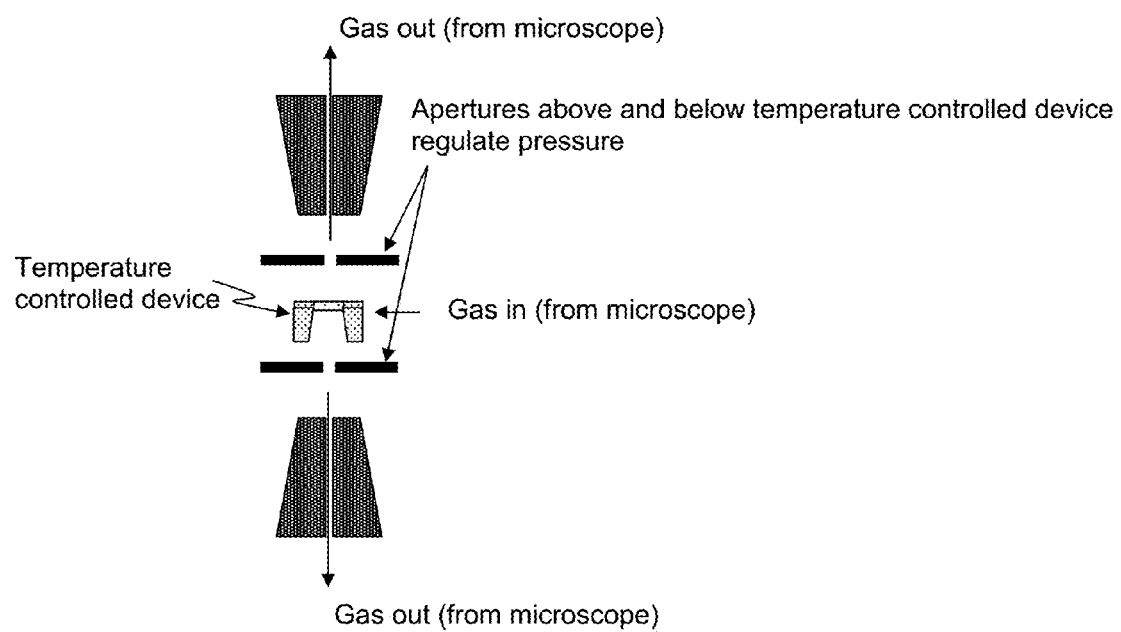
FIG. 8a illustrates a cross-sectional view of an environmental cell (E-cell) formed using a single temperature controlled device, with apertures above and below the heating device.

When a temperature control device is used in a microscope that has built-in capabilities to control the environment around a specimen, it is a 1-device environmental cell. The specimen temperature is controlled using elements on the temperature control device, and its gas environment is controlled using features of the microscope, for example a differentially pumped aperture column. In this embodiment, gas is introduced near the specimen and pressure within the column is controlled using a series of apertures between the specimen and the microscope vacuum pumps. A differentially-pumped system places constraints on the types of experimental gases used and the maximum pressure at the specimen. A schematic of a differentially-pumped system is shown in FIG. 8a.

Figure 8B:
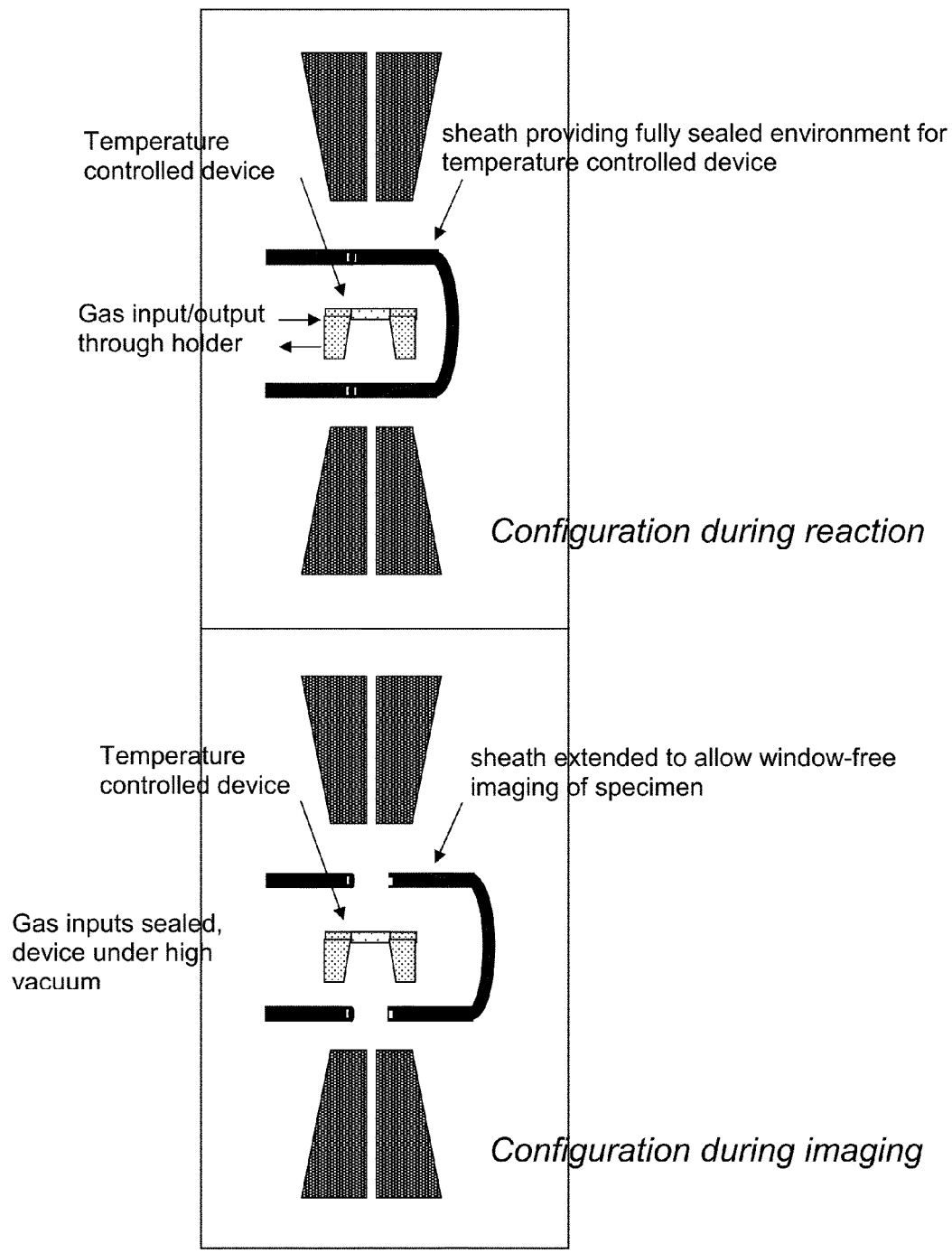
FIG. 8b illustrates a cross-sectional view of an environmental cell (E-cell) formed using a single temperature controlled device, enclosed by a sealed, retractable sheath.

An alternative 1-device environmental cell embodiment would control specimen temperature using elements on the temperature control device, and control its gas environment using additional features of the holder. For example, such a system may include a retractable sheath that can provide a sealed environment around the temperature control device during reactions. Upon completion of the reaction, after reactant gases have been evacuated from the sheath and the volume within the sheath has been returned to high vacuum, the sheath can be retracted or shifted to a position outside of the path of the electron beam to enable high-resolution imaging. This approach would not permit in situ imaging (imaging during the reaction), but it would allow users to quickly image specific, identical locations before and after reactions. It would also offer users greater flexibility with respect to reactant gases and pressures. A holder-based 1-device environmental cell is shown in FIG. 8b.

One method for manufacturing a 2-device E-cell is to use two window devices to provide gas or liquid control. The window devices could have continuous or perforated membrane regions.

Another method for manufacturing a 2-device E-cell is to use one window device and one temperature control device. The two devices could be configured so that the electron beam is first incident upon the window device before it is incident upon the temperature control device, or the two devices could be configured so that the electron beam is first incident upon the temperature control device before it is incident upon the window device. Both configurations allow both confinement and control of gases and/or liquids as well as temperature control at the specimen. Small gas and/or liquid leaks may occur in the microscope in these configurations. Also, small holes may exist in one or both membrane regions to reduce the scattering of the electron beam. In one alternative, the window device may be mounted on a retractable component of the holder, allowing the removal of the window device from above or below the temperature control device once the reaction has occurred. In a scanning electron imaging mode, low resolution in situ imaging would be possible while the window device in the holder is in place over the temperature control device. When the window device in the holder is retracted, high resolution, post-reaction imaging of the specimen could be performed in either scanning electron or transmission electron imaging modes. Notably, the distance between membrane regions when the devices are stacked (i.e., the sample chamber) is preferably about 50 µm to about 5 mm.

Yet another method for manufacturing a 2-device E-cell is to use two temperature control devices. The two devices could be configured so that the membrane regions of both devices are oriented toward the electron beam, or the membrane regions of both devices are oriented away from the electron beam, or one membrane region of one device is oriented toward and the membrane region of the other device is oriented away from the electron beam. All of these configurations allow for both confinement and control of gases and/or liquids as well as temperature control at the specimen. Small gas and/or liquid leaks may occur in the microscope in these configurations. Also, small holes may exist in one or both membrane regions to reduce the scattering of the electron beam. Notably, the distance between membrane regions when the devices are stacked (i.e., the sample chamber) is preferably about 50 µm to about 5 mm.

Figures 9A, 9B:
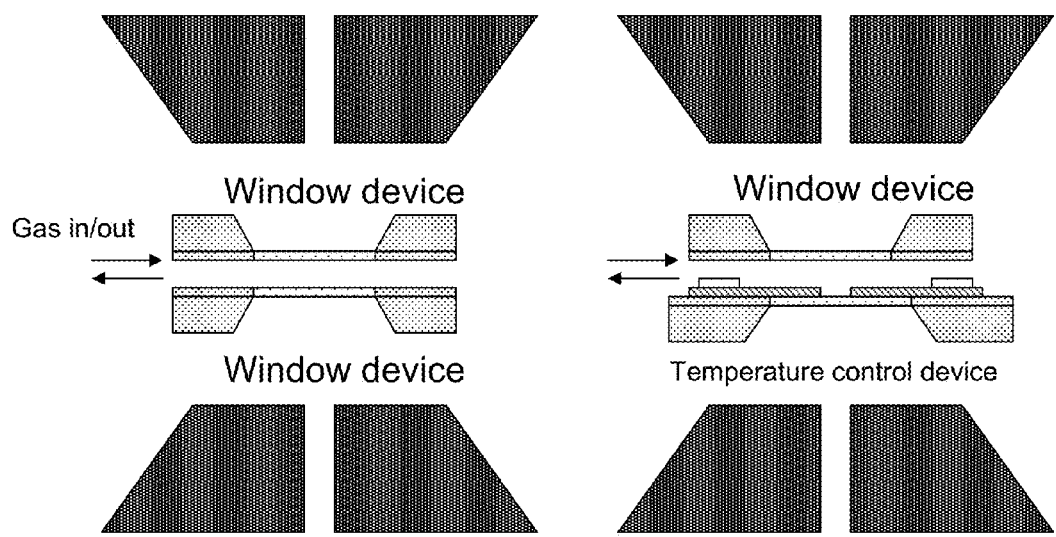
FIG. 9A, illustrates a cross-sectional view of environmental cells (E-cells) formed using two devices, wherein an environmental cell is shown with two window devices.
FIG. 9B, illustrates a cross-sectional view of environmental cells (E-cells) formed using two devices, wherein an environmental cell is formed using one window device and one temperature controlled device.

Embodiments of E-cells with two devices are shown in FIG. 9. For example, in FIG. 9A, an environmental cell is shown with two window devices. Such a cell does not allow for in situ heating. In FIG. 9B, an environmental cell is formed using one window device and one temperature controlled device. This approach allows for in situ heating. Notably, the distance between membrane regions when the devices are stacked (i.e., the sample chamber) is preferably about 50 µm to about 5 mm.

Figure 8C:
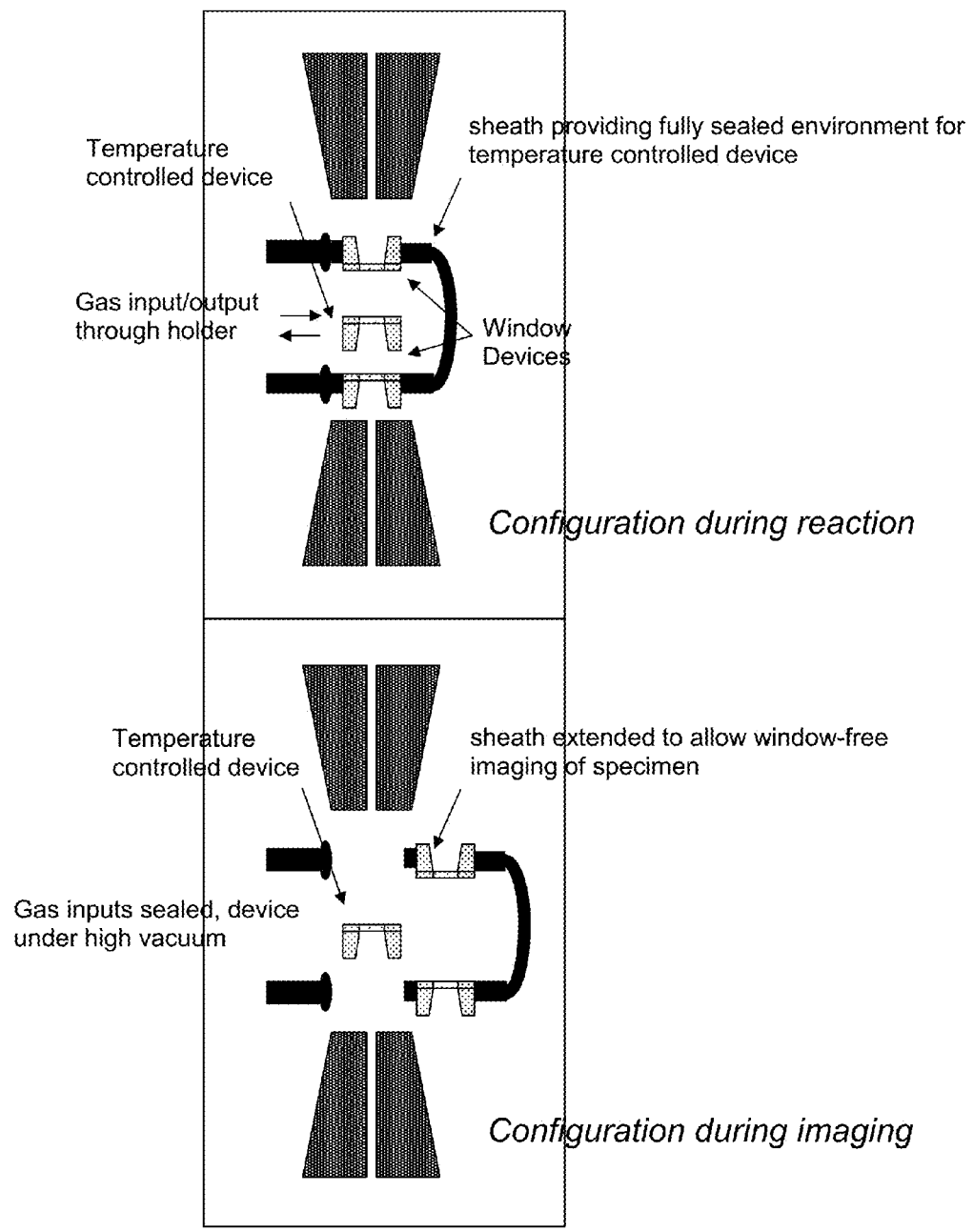
FIG. 8c illustrates a cross sectional view of an environmental cell (E-cell) formed using a single temperature controlled device, enclosed by a sealed, retractable sheath, which holds two windows devices above and below the temperature controlled device.

Another aspect relates to a method for manufacturing an E-cell using three devices, typically two window devices and one temperature control device, but any combination and orientation of temperature control devices and window devices is contemplated. An E-cell comprised of two window devices and one temperature control device will allow perforations to be made in the temperature control device where the specimen is typically placed, yet completely contain the gases and/or liquids by using non-perforated window devices stacked above and below. This configuration also allows for the entry and exit of gases and/or liquids from top to bottom (downwards through the temperature control device), or bottom to top (upwards through the temperature control device). Also, the window devices may be mounted on a retractable component of the holder, allowing the removal of the window devices from the above and/or below the temperature control device once the reaction has occurred. An E-cell with three devices and a retractable component of the holder is shown in FIG. 8c. In situ imaging would be possible with the window devices extended, but when retracted, would allow the post reaction specimen to be observed at a higher resolution without any interference from the window devices. Notably, the distance between membrane regions when the devices are stacked (i.e., the sample chamber) is preferably about 50 µm to about 5 mm.

Figure 10:
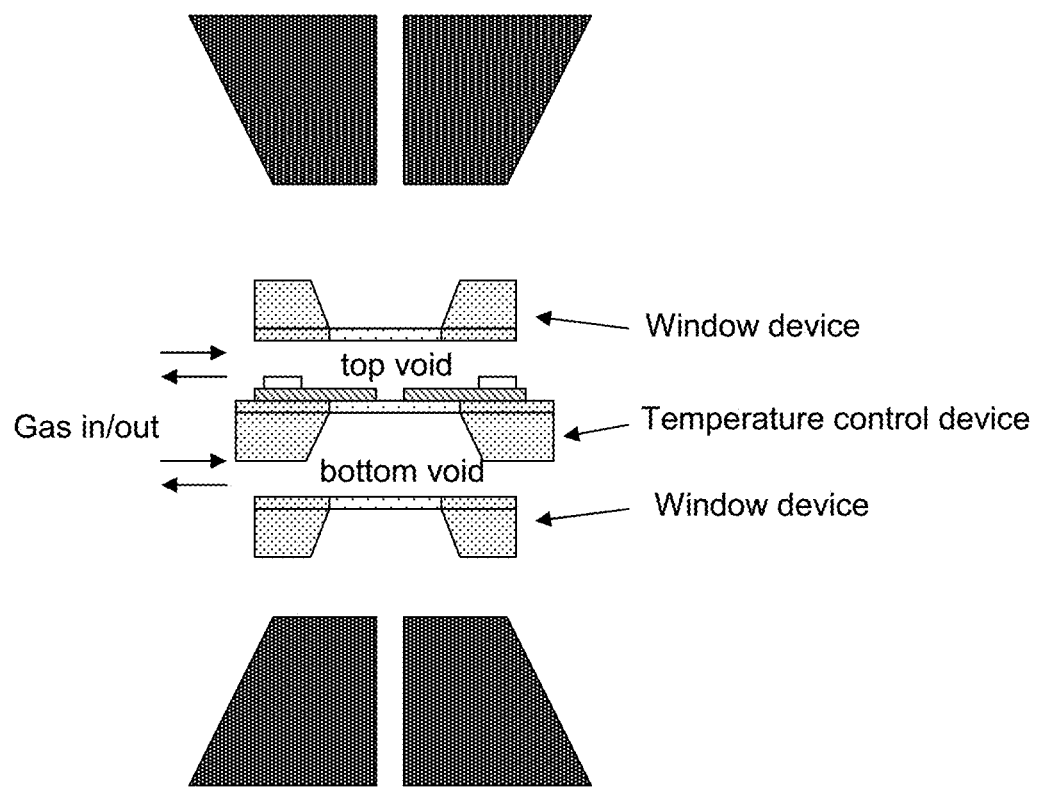
FIG. 10 illustrates a cross-section of an environmental cell (E-cell) formed using three devices.

An E-cell with three devices is shown in FIG. 10. With regards to FIG. 10, the upper and lower devices are window devices and a temperature control device is placed between the window devices. The temperature control device enables in situ heating, and the sample under analysis is imaged through the window devices. Notably, the distance between membrane regions when the devices are stacked (i.e., the sample chamber) is preferably about 50 µm to about 5 mm.

Gas ports are typically flanked within the holder apparatus on either side of the device to ensure complete gas flow across the observation area within the E-cell. In a two or three device stack, however, the gas entrance and/or exits may occur either in the top void or the bottom void of the E-cell, either allowing gas to primarily flow through one void or through the sample and into both voids. Importantly, in contrast to the devices of the prior art which typically have gas/fluid ports machined into the device, the gas ports are a part of the device holder.

Temperature may be manipulated and/or controlled in an E-cell without the use of a temperature control device. The liquid and/or gas introduced into the E-cell could be pre-heated or pre-cooled to set the temperature of the specimen within the E-cell. The pre-heated or pre-cooled gas could be used to establish a temperature gradient between the introduced gas and/or liquid and the specimen within the E-cell. Pre-cooled or pre-heated liquid and/or gas could also be used within an e-cell that contains a temperature control device.

To define the thickness of the voids between devices in an E-cell, a separate apparatus or spacer may be manufactured and placed in between the devices. By controlling the thickness of these spacers, the total thickness of the voids (and total thickness of the E-cell) may be controlled. When made of a soft material, these spacers may also be used to seal the devices themselves, forming the E-cell. Another method for controlling the total thickness of the voids between the devices comprising an E-cell is to pattern spacers directly onto the surface of the devices. When devices are stacked or otherwise arranged to form an E-cell, the thickness of these spacers define the total thickness of the void. When devices are stacked front to back, the frame itself defines the majority of the thickness of the void—by controlling and choosing the frame thickness, the overall E-cell thicknesses can be controlled.

Multiple spacer layers may be used between devices of an E-cell. Multiple spacer layers may be integrated onto the surface of one or more of the devices of an E-cell. The presence of one or more spacers on the devices comprising an E-cell allows for mixing and matching of the overall spacer height between devices and therefore allows control of the size and volume of the voids between the devices comprising the E-cell.

When more than one device is used to create an E-cell, the devices of the E-cell could also be manufactured to interlock in such a way as to produce a precise gap between adjacent devices. In this manner, the spacing between devices is a result of stacking the devices. Interlocking device designs could also be used in conjunction with separate spacers such as washers to control the overall dimensions and spacing of the E-cell.

When more than one device is used to create an E-cell, spacing between the devices of the E-cell could be created by the way in which the devices are loaded into the holder. In one embodiment, the holder could be manufactured with a built-in spacer whereby one device of the E-cell is loaded above the built-in spacer and the other device(s) of the E-cell are loaded below the built-in spacer.

In another aspect, a process of making the device(s) is described. Two approaches are described to fabricate devices. Both approaches use two material layers with differing resistivity to control the path of electrical current through the membrane region of the device. The first approach is a "bilayer" structure, where a single type of material has two discrete layers with different resistivities. The second "metal electrode" approach uses two different materials with different resistivity, with the lower-resistivity material in one embodiment being a refractory metal. In each case, the shape of the lower-resistivity feature or features and the distance between features when multiple features are present determines the path of the electrical current.

Figure 11:
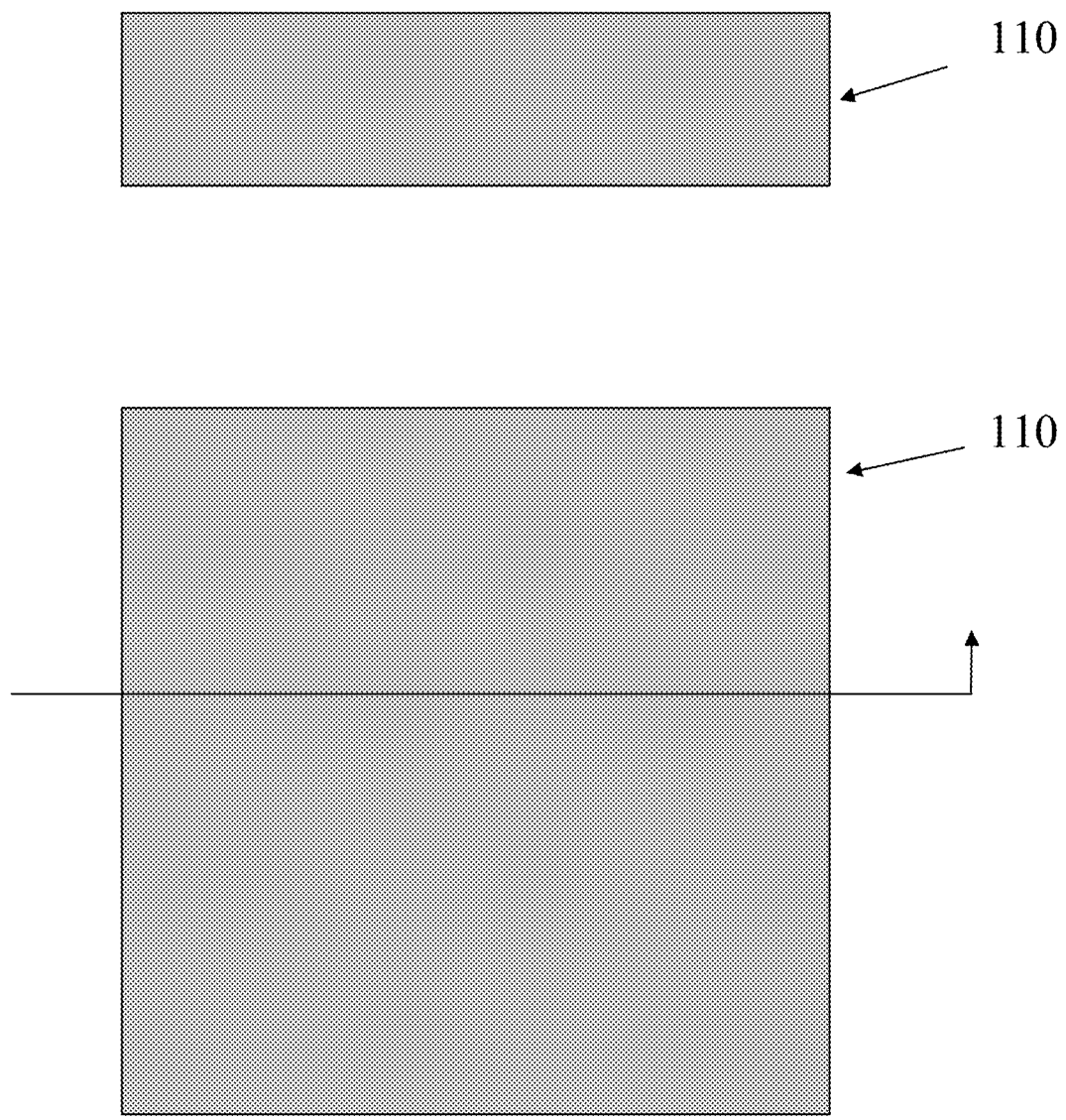
FIGS. 11-17 illustrate the fabrication of one embodiment of the device described herein having a bilayer structure.

A bilayer structure is a device with a membrane region comprised of low-resistivity and high-resistivity layers, containing holes, supported by a frame, and contacted through metal pads. One embodiment of the bilayer structure is fabricated as follows:

(1) Start with a substrate 110, preferably crystalline silicon having about 1-10 ohm-cm resistivity and about 0.3 mm thickness. It should be appreciated that substrate 110 may have a different composition, resistivity, and thickness, as described herein. Substrate 110 is illustrated in FIG. 11.

(2) Next, deposit (e.g. LPCVD) or grow (e.g. wet thermal or dry thermal) electrically insulating material 120, preferably 50 nm of thermally grown silicon dioxide, on substrate 110. It should be appreciated that the electrically insulating material 120 may have a different composition and/or thickness, as described herein, and be deposited or grown using other techniques.

(3) Next, deposit high-resistivity semiconductor or ceramic material 130, preferably about 300 nm nanocrystalline LPCVD silicon carbide having a resistivity of about 1-10 ohm-cm, on electrically insulating material 120. It should be appreciated that the high-resistivity semiconductor or ceramic material 130 may be of a different composition, resistivity, and/or thickness, as described herein, and be deposited or grown using other techniques.

(4) Next, deposit low-resistivity semiconductor or ceramic material 140, preferably about 300 nm nanocrystalline LPCVD silicon carbide with resistivity of about 0.01-0.10 ohm-cm, on high-resistivity semiconductor or ceramic material 130. It should be appreciated that low-resistivity semiconductor or ceramic material 140 may have a different composition, resistivity, and/or thickness, as described herein, and be deposited or grown using other techniques.

Figure 12:
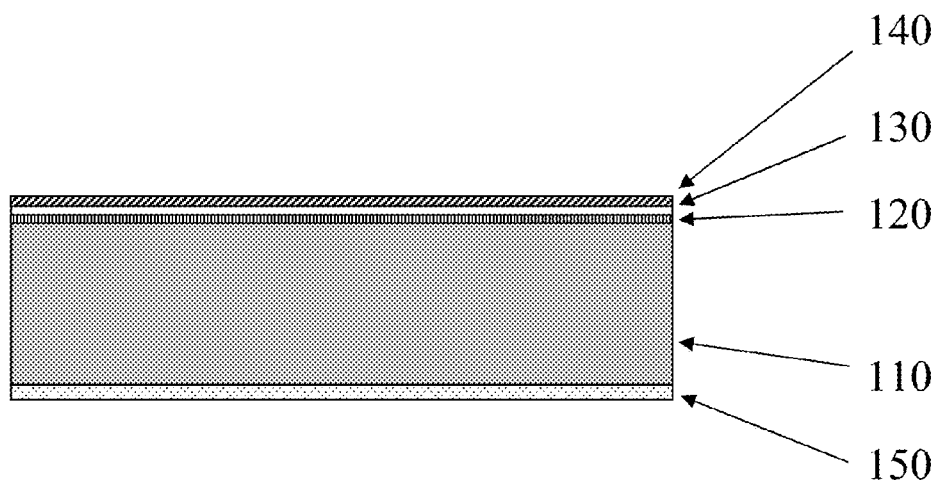
Figure 12:
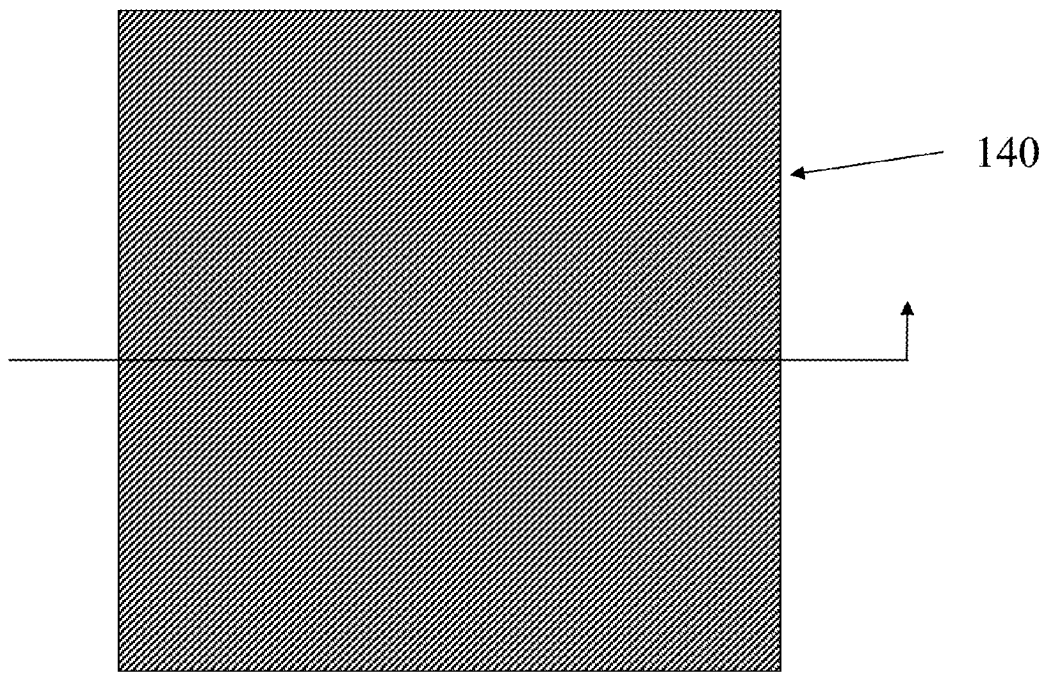

(5) Next, deposit hard mask material 150 which will be used to define the device frame region on substrate 110, said hard mask material 150 being preferably about 200 nm LPCVD silicon nitride. It should be appreciated that hard mask material 150 may have a different composition and/or thickness, as described herein, and be deposited or grown using other techniques. Substrate 110 with electrically insulating material 120, high-resistivity and low-resistivity semiconductor or ceramic materials 130 and 140 respectively, and hard mask material 150 layers are illustrated in FIG. 12.

Figure 13:
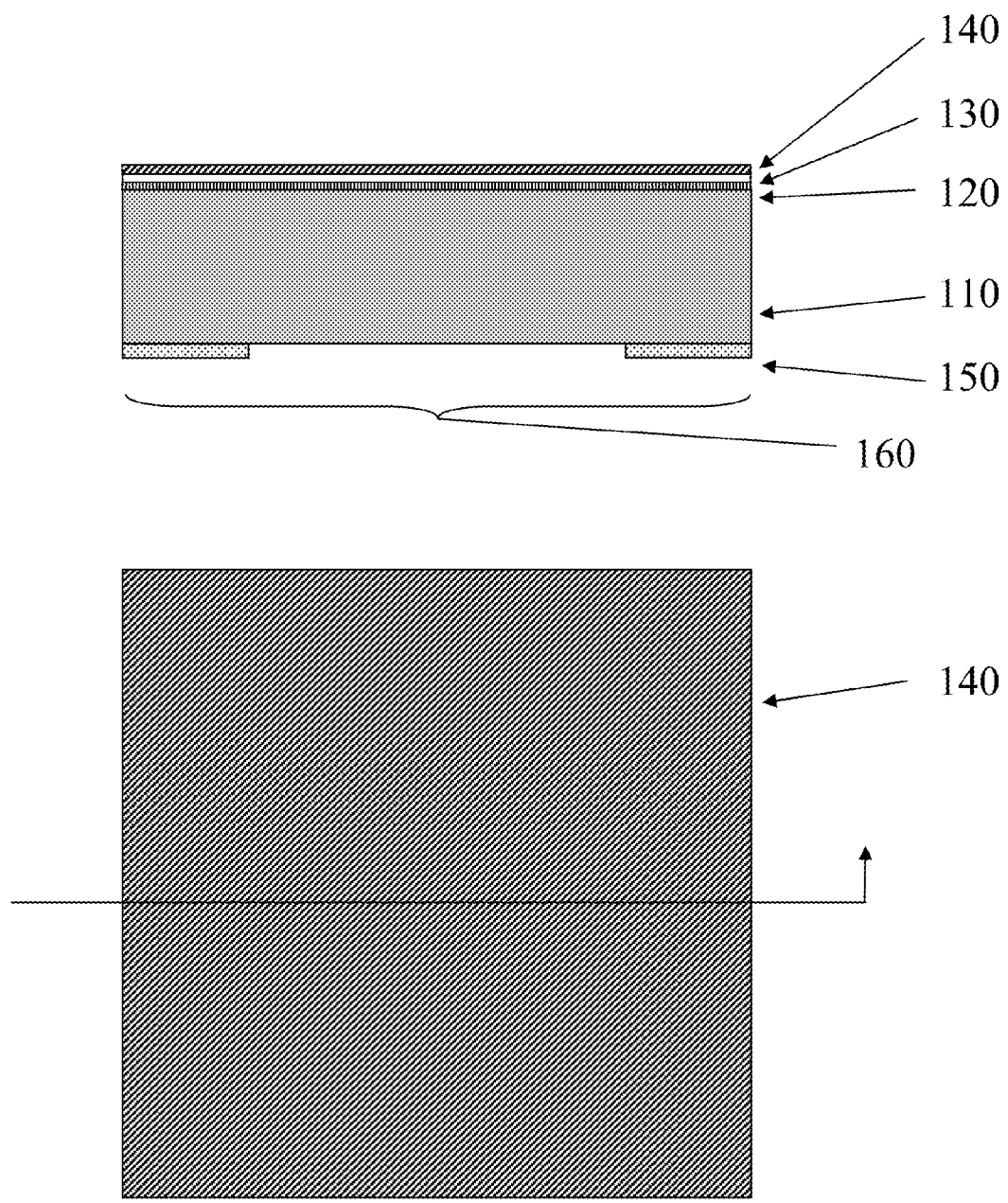

(5) Next, define hard mask material 150 to create device frame region 160, preferably using a photolithography process followed by a nitride etch process. Other lithographic and etch techniques may be used, as readily determined by one skilled in the art. The size and shape of the device frame region 160 may vary, and this feature will ultimately determine the size and shape of the membrane. The device frame region 160 is illustrated in FIG. 13.

Figure 14:
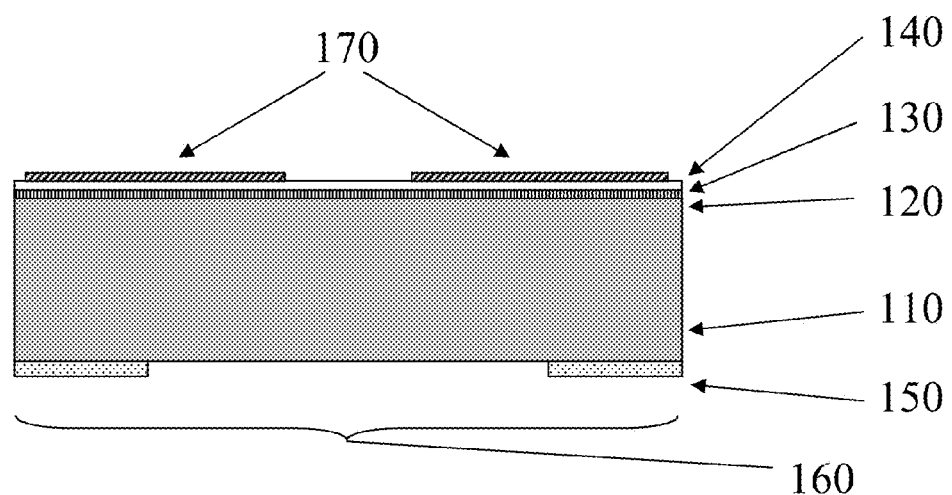
Figure 14:
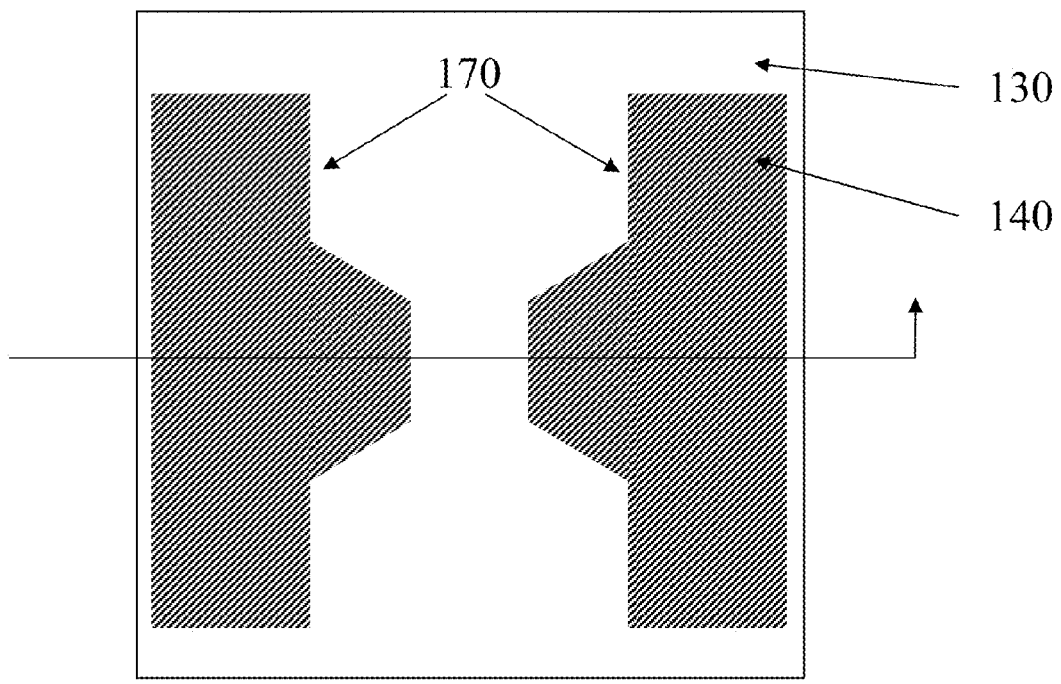

(6) Next, pattern low-resistivity material 140 to define heat source elements 170, preferably using a photolithography step followed by reactive ion etching, although other techniques may be used as readily determined by one skilled in the art. The etch process fully removes the low-resistivity material 140 in regions not covered by photoresist. The heat source elements 170 are illustrated in FIG. 14.

Figure 15:
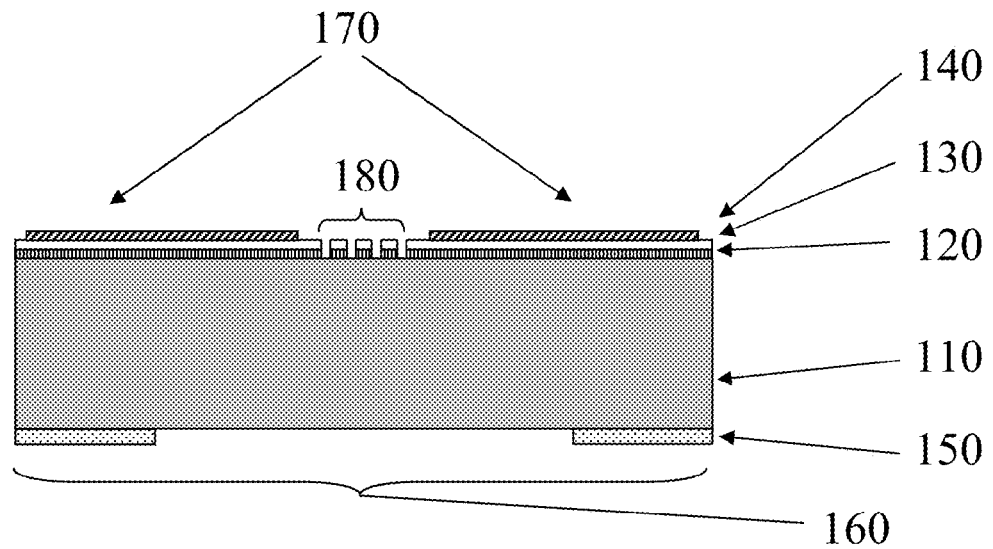
Figure 15:
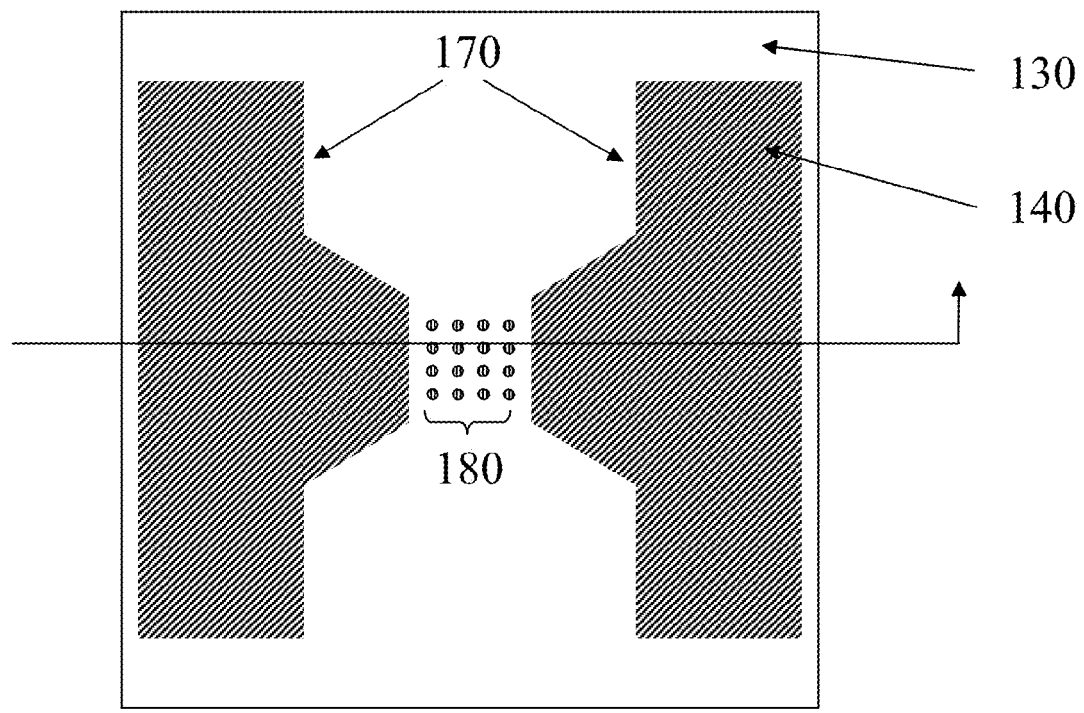

(7) Next, pattern hole features 180 in high-resistivity material 130, preferably using a photolithography step followed by reactive ion etching, although other techniques may be used as readily determined by one skilled in the art. In regions with hole features 180, the exposed high-resistivity material 130 and electrically insulating material 120 is fully removed. Importantly, the size and shape of the hole features 180 may vary, as readily determined by one skilled in the art. Hole features 180 are shown in FIG. 15.

(8) Next, deposit metal layer 190 for contact pad formation, preferably about 100 nm tungsten layer deposited via PVD. It should be appreciated that a thin conductive etch stop layer, equal to or less than the thickness of layer 190, may be deposited before metal layer 190 for the purpose of protecting any layers underneath from the etch process used to pattern metal layer 190. This etch stop layer would then be removed with an etch process that will not appreciably etch the layers underneath layer 190. It should be appreciated that alternate metal layer 190 compositions and thickness may be used, as described herein. Alternate deposition techniques may also be used, as readily determined by one skilled in the art.

Figure 16:
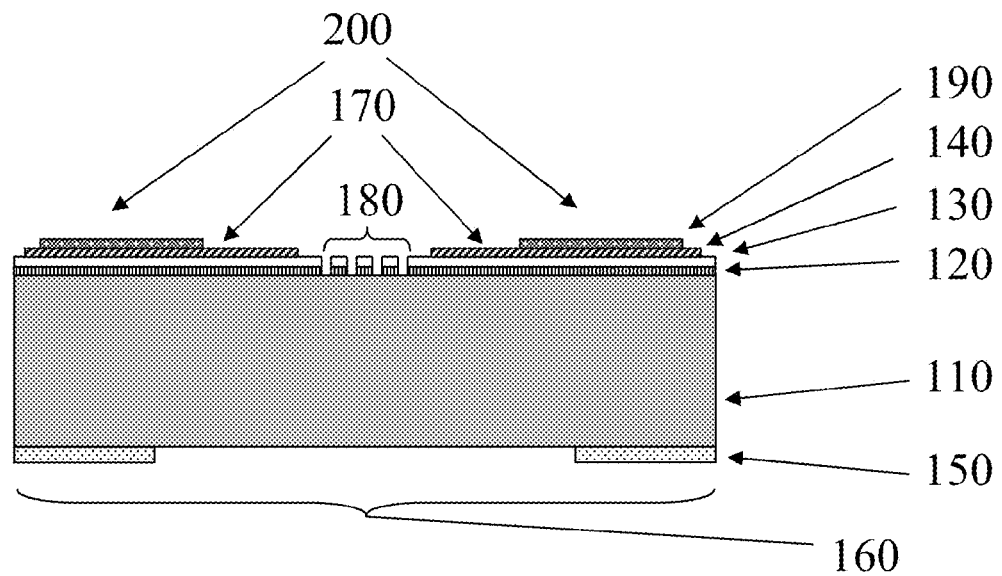
Figure 16:
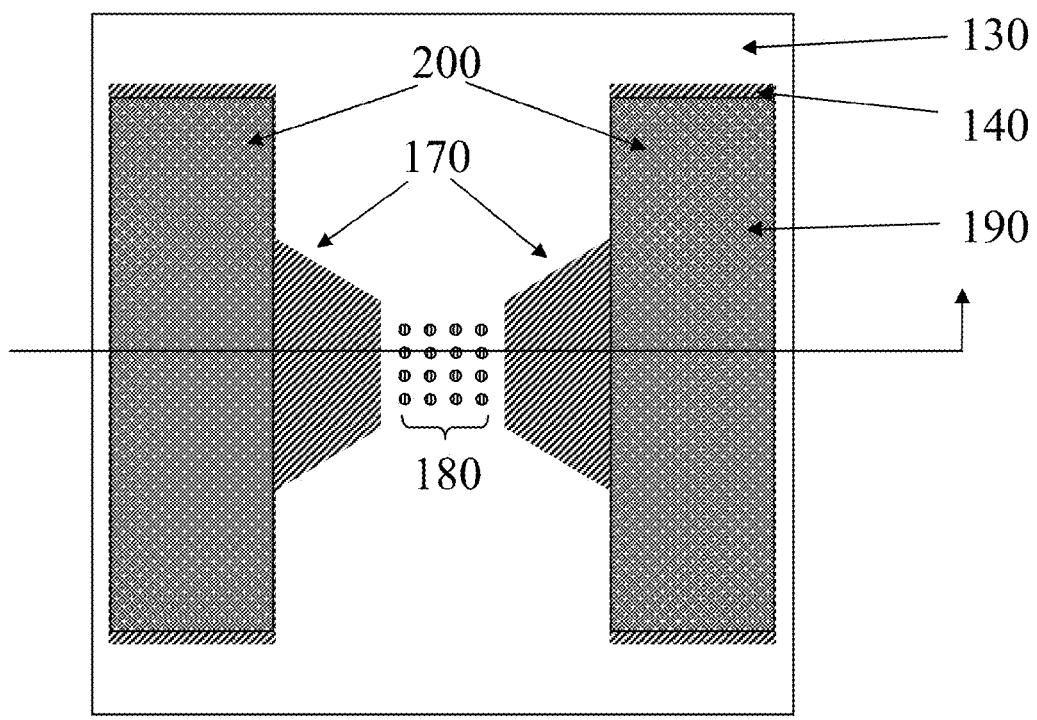

(9) Next, pattern metal layer 190 to form contact pads 200, preferably using a photolithography step followed by wet chemical etching, although other techniques may be used as readily determined by one skilled in the art. Alternate contact pad fabrication methods may include lift-off photolithography followed by metal layer 190 deposition, such as gold or platinum, and resist removal. Metal contact pads 200 are formed on and generally fully enclosed by regions with low-resistivity material 140. After the formation of contact pads 200, the contact pads 200 may be covered with protective material (e.g., ProTEK® B1-18, Brewer Science, USA) to avoid possible degradation during subsequent substrate 110 etch step. Contact pads 200 are illustrated in FIG. 16.

Figure 17:
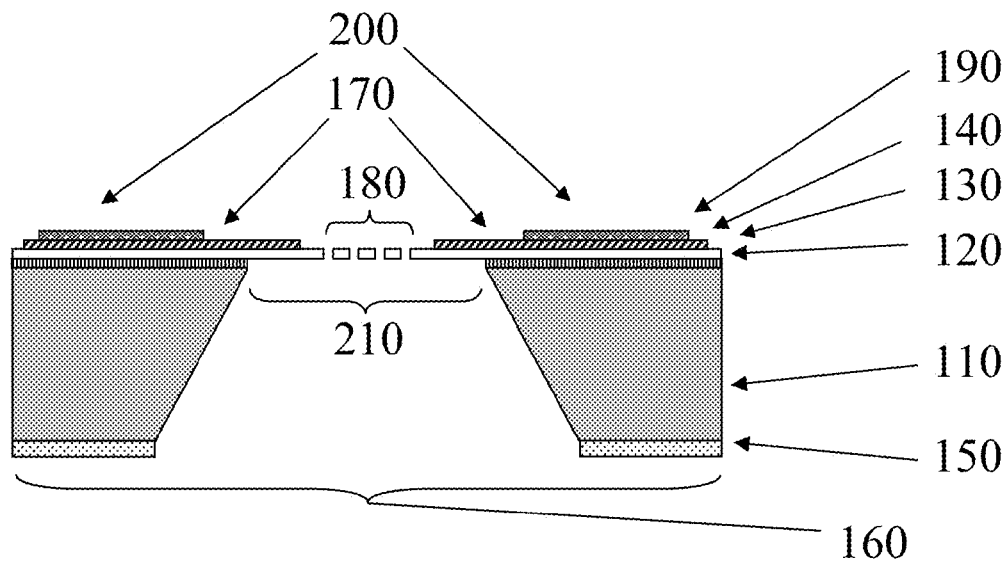
Figure 17:
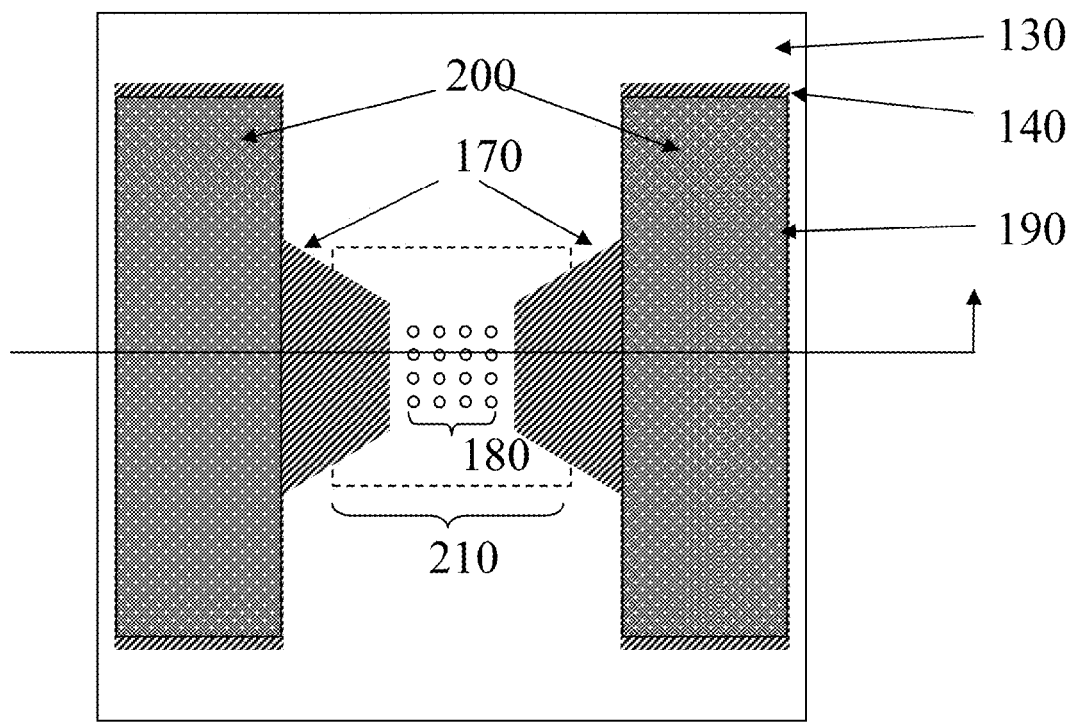

(10) Next, fully etch substrate 110 through device frame features 160 to form membrane region 210. For the preferred silicon substrate, silicon etchant is preferably heated potassium hydroxide (KOH) solution. Hard mask material 150, low-resistivity material 140, and high-resistivity material 130 are preferably resistant to substrate 110 etchant. Device structure following substrate etch is illustrated in FIG. 17.

In another embodiment, step (8) may be effectuated prior to steps (6) and (7).

Figure 18:
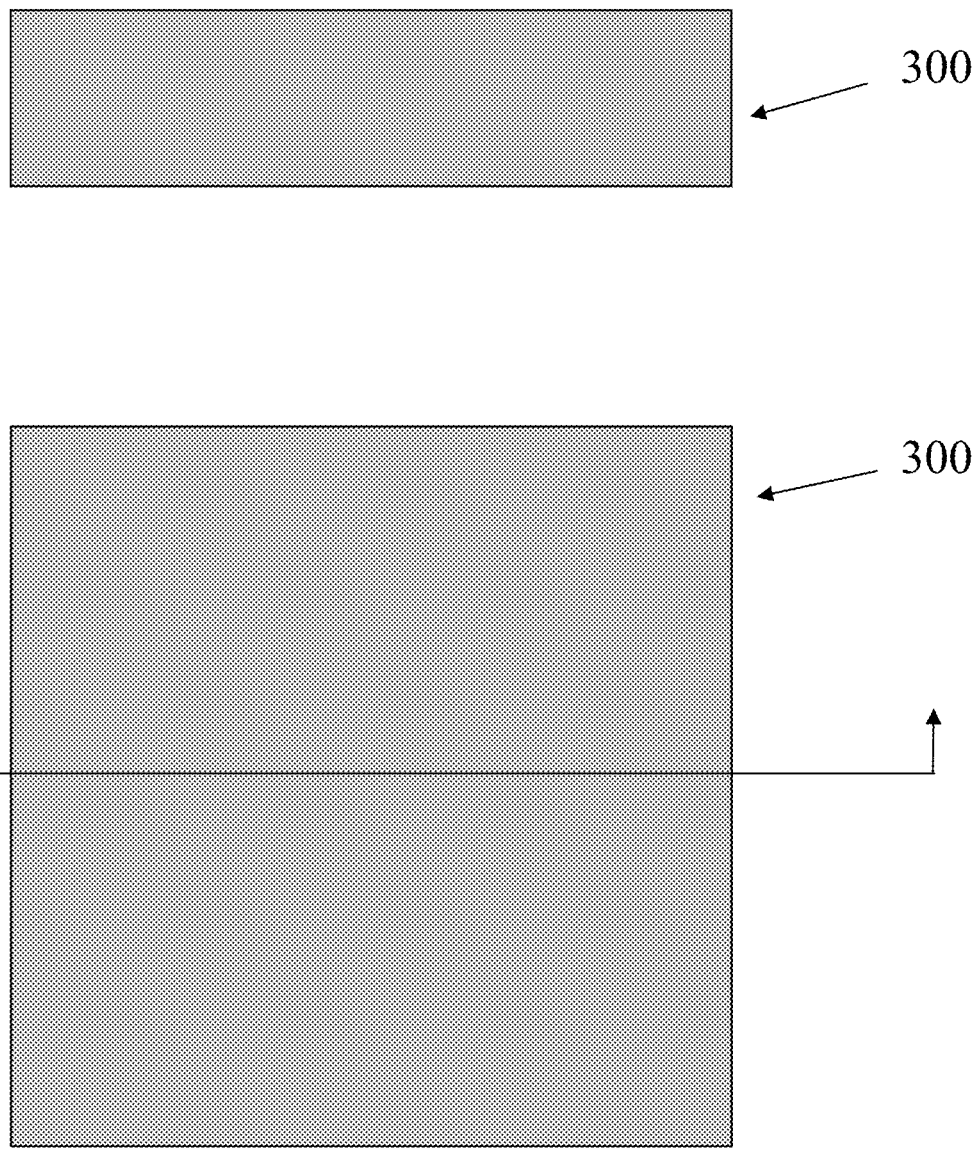
FIGS. 18-23 illustrate the fabrication of another embodiment of a device described herein having a metal electrode structure.

The metal electrode structure embodiment is comprised of a membrane region of high-resistivity material, containing holes, supported by a frame, and contacted through refractory metal electrodes. One embodiment of the refractory metal electrode structure is fabricated as follows:

(1) Start with a substrate 300, preferably crystalline silicon having about 1-10 ohm-cm resistivity and about 0.3 mm thickness. It should be appreciated that substrate 300 may have a different composition, resistivity and thickness, as described herein. Substrate 300 is illustrated in FIG. 18.

(2) Next, deposit or grow electrically insulating material 310, preferably about 50 nm of wet or dry thermally grown silicon dioxide, on substrate 300. It should be appreciated that electrically insulating material 310 may be a different composition and/or thickness, as described herein, and be deposited or grown using other techniques.

(3) Next, deposit high-resistivity semiconductor or ceramic material 320, preferably about 300 nm nanocrystalline LPCVD silicon carbide with resistivity of about 1 ohm-cm, on electrically insulating material 310. It should be appreciated that high-resistivity semiconductor or ceramic material 320 may have a different composition, resistivity, and/or thickness, as described herein, and be deposited or grown using other techniques.

Figure 19:
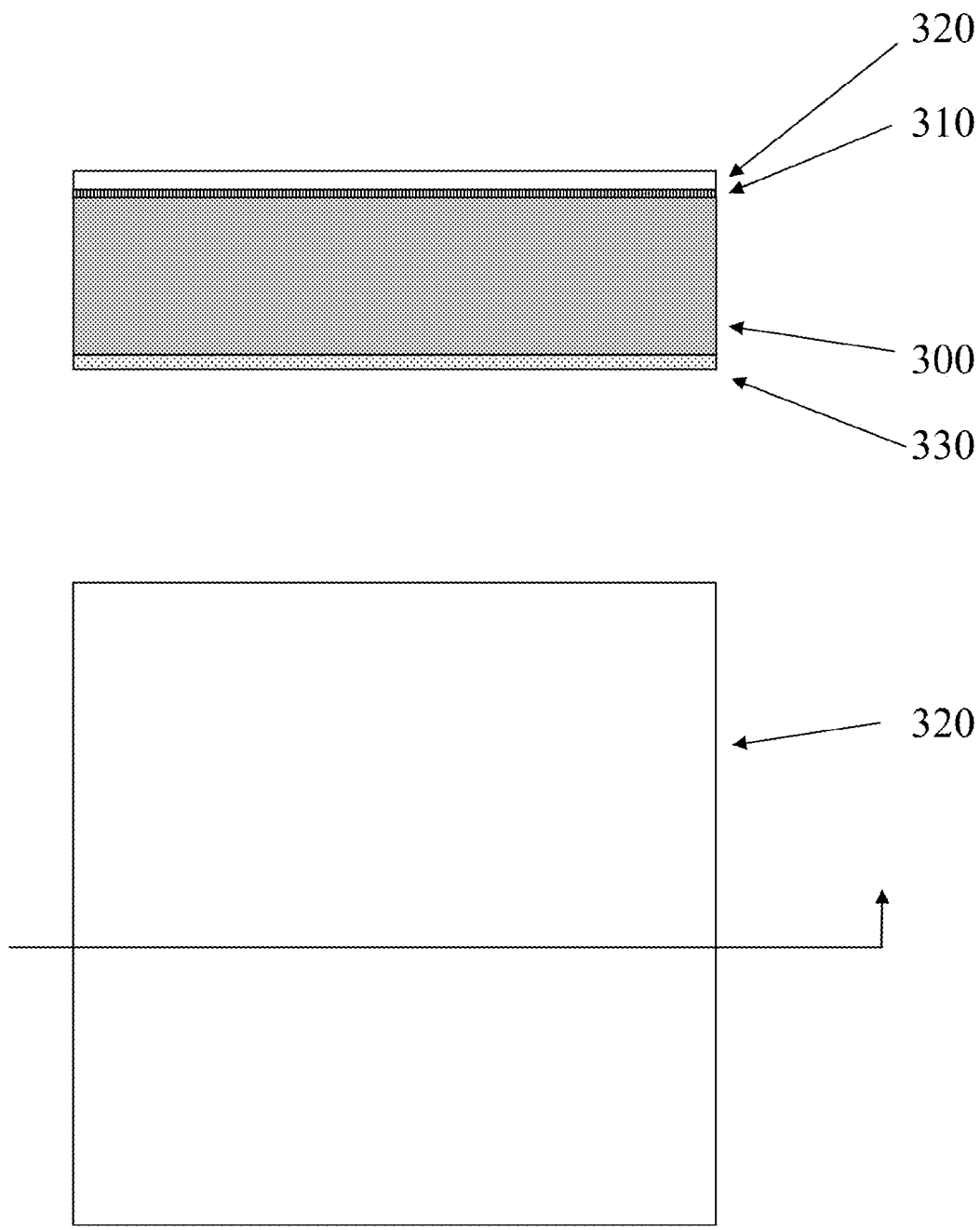

(4) Next, deposit hard mask material 330 which will be used to define the device frame region on substrate 300, preferably about 200 nm LPCVD silicon nitride. It should be appreciated that the hard mask material 330 may have a different composition and/or thickness, as described herein, and be deposited or grown using other techniques. Substrate 300 with electrically insulating material 310, high-resistivity semiconductor or ceramic material 320, and hard mask material 330 layers are illustrated in FIG. 19.

Figure 20:
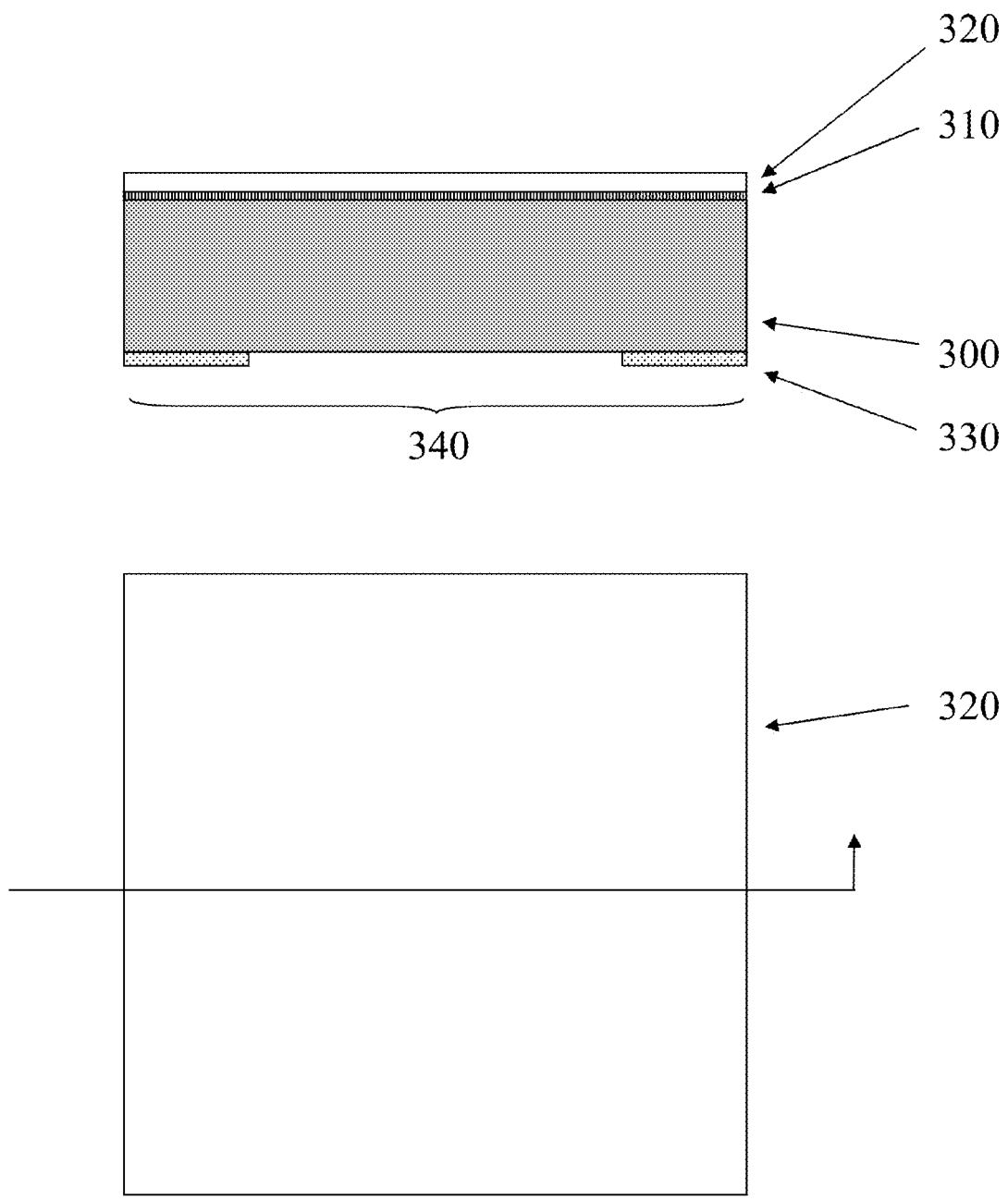

(5) Next, define hard mask material 330 to create device frame region 340, preferably using a photolithography process followed by a nitride etch process, although other techniques may be used as readily determined by one skilled in the art. The size and shape of the device frame region 340 may vary, as readily determined by those skilled in the art, and this feature will ultimately determine the size and shape of the membrane. The device frame region 340 is illustrated in FIG. 20.

Figure 21:
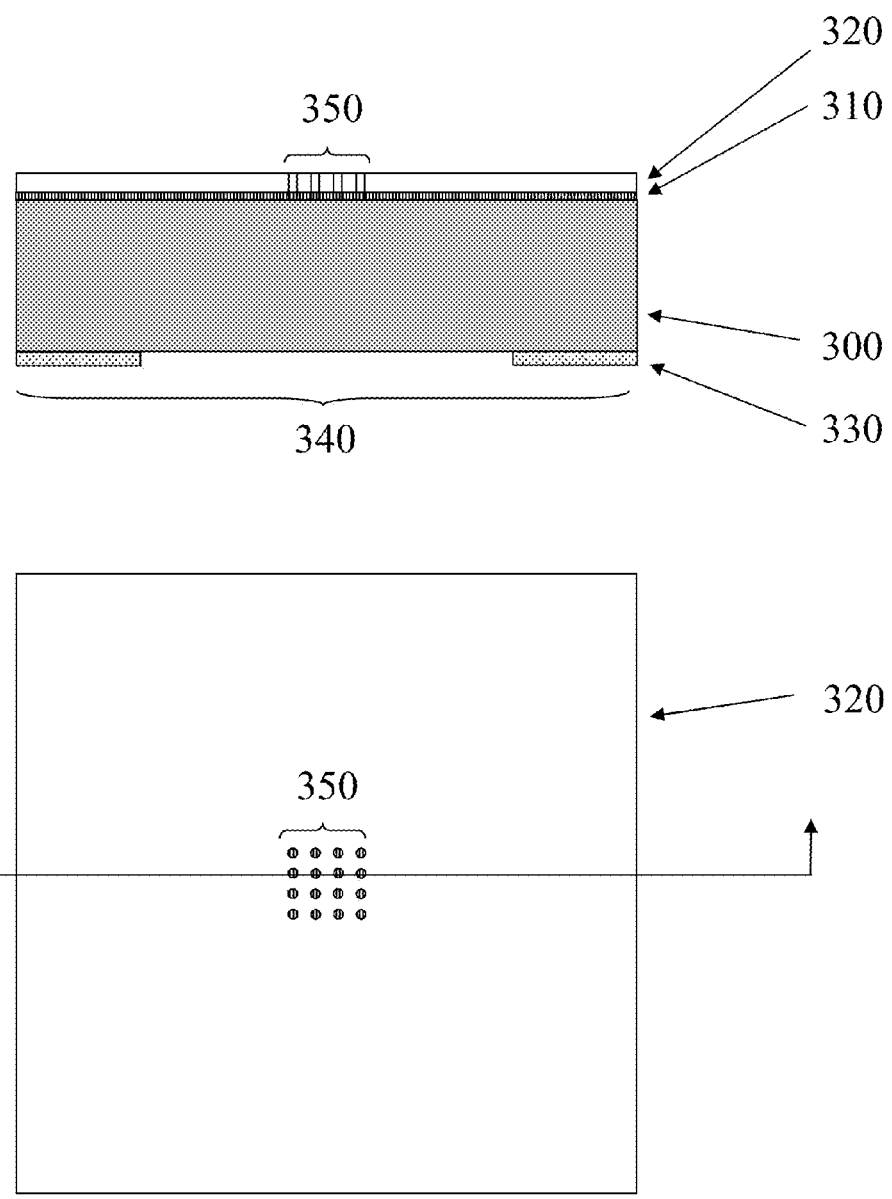

(6) Next, pattern hole features 350 in high-resistivity material 320, preferably using a photolithography step followed by reactive ion etching, although other techniques may be used as readily determined by one skilled in the art. In regions with hole features 350, the exposed high-resistivity material 320 and electrically insulating material 310 is fully removed. The size and shape of the hole features 350 may vary, as readily determined by those skilled in the art. Hole features 350 are shown in FIG. 21.

(7) Next, deposit refractory metal layer 360 for heat source element and contact pad formation, preferably about 100 nm tungsten layer deposited via PVD. It should be appreciated that a thin, equal to or less than the thickness of layer 360, conductive etch stop layer may be deposited before metal layer 360 for the purpose of protecting any layers underneath from the etch process used to pattern metal layer 360. This etch stop layer would then be removed with an etch process that will not appreciably etch the layers underneath layer 360. Alternate refractory metal layer 360 compositions and thickness may be used. In addition, alternate deposition techniques may also be used.

Figure 22:
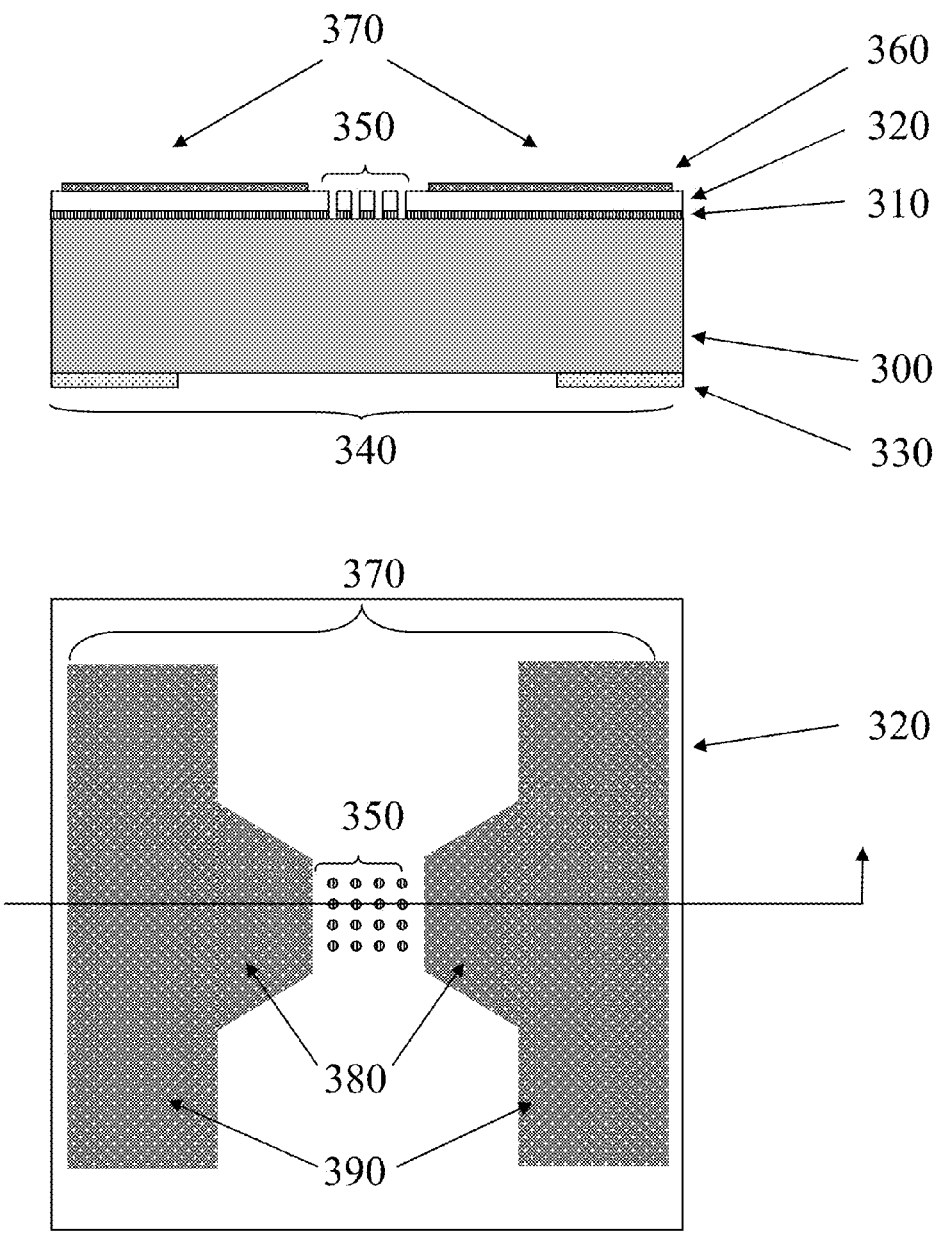

(8) Next, pattern refractory metal layer 360 to form refractory metal regions 370 comprised of heat source elements 380 and contact pads 390, preferably using a photolithography step followed by wet chemical etching. It should be appreciated that other lithographic and etch techniques may be used. Alternate contact pad fabrication methods may include lift-off photolithography followed by metal layer 360 deposition and resist removal. Contact pads 390 are formed on and generally fully enclosed by high-resistivity material 320. After the formation of contact pads 390, the contact pads 390 may be covered with protective material to avoid possible degradation during subsequent substrate 300 etch step such as KOH. Heat source elements 380 and contact pads 390 are illustrated in FIG. 22.

Figure 23:
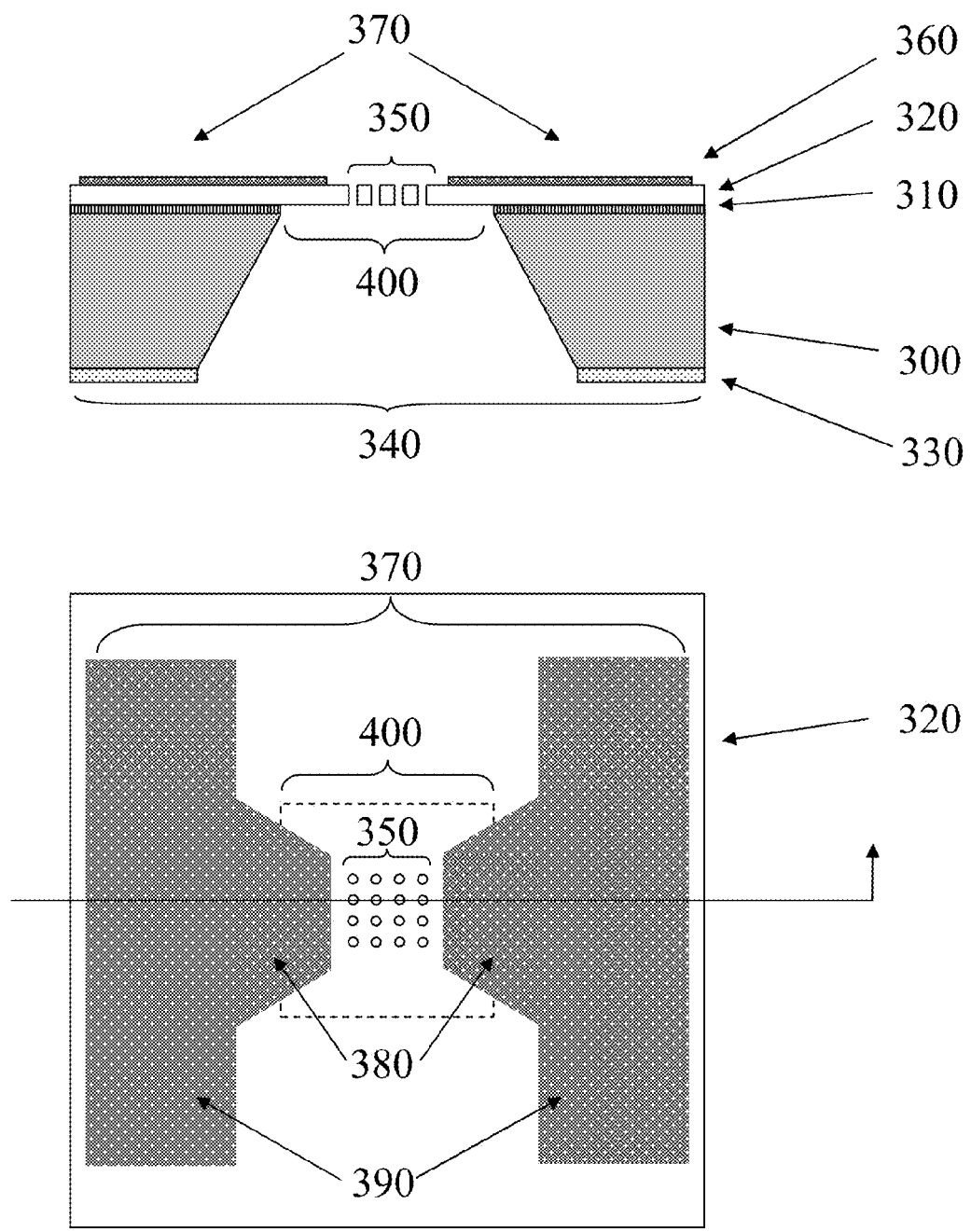

(9) Next, fully etch the silicon substrate 300 through device frame features 340 to form membrane region 400. For the preferred silicon substrate, the silicon etchant is preferably heated potassium hydroxide (KOH) solution. Hard mask material 330 and high-resistivity material 320 are preferably resistant to substrate 300 etchant. The device structure following substrate etch is illustrated in FIG. 23.

In another embodiment, step (7) may be effectuated prior to step (6).

It should be appreciated that alternative substrates may used to fabricate the devices described herein. For example, SOI (silicon on insulator) substrates rather than bulk substrates could be used to manufacture devices with thinner frames.

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art, based on the disclosure herein. The invention therefore is to be broadly construed, as encompassing all such variations, modifications and alternative embodiments within the spirit and scope of the claims hereafter set forth.

We claim:

1. A device comprising:
   (a) a membrane comprising at least one membrane observation region, said membrane having a top side and a bottom side;
   (b) at least two conductive heat source elements in contact with the top side of the membrane;
   (c) a pressure sense element patterned directly across the top side of the membrane in the observation region,
   wherein the membrane observation region is heatable, and wherein the membrane and the at least two heat source elements are both conductive, ceramic materials.

2. The device of claim 1 wherein the membrane region comprises one or more holes or one or more dimples therein.

3. The device of claim 1 wherein the at least two heat source elements flank the at least one membrane observation region.

4. The device of claim 1 wherein the at least two heat source elements flank the pressure sense element.

5. The device of claim 1 wherein the membrane is supported by a frame located on the bottom side of the membrane and positioned around the perimeter of the device.

6. The device of claim 1, wherein the at least two heat source elements are arranged so that current can be forced through the membrane thus allowing Joule heating to occur in the membrane observation region.

7. The device of claim 1, wherein the membrane consists of a first ceramic material having a first conductivity, wherein the first ceramic material is silicon carbide, boron nitride, or aluminum nitride.

8. The device support of claim 1 wherein the at least two heat source elements are relatively more conductive than the membrane.

9. The device of claim 1 wherein the at least two heat source elements comprise material patterned directly on the at least one membrane, wherein said material consists of a second ceramic material having a second conductivity, wherein the second ceramic material is silicon carbide, boron nitride, or aluminum nitride.

10. The device of claim 1, wherein at least one metal pad is applied on each heat source element.

11. The device of claim 1, wherein the pressure sense element is a metal thin film resistor such that upon deformation, the electrical resistance of the pressure sense element changes.

12. The device of claim 1, wherein the membrane is constructed as a stack of material layers with different electrical conductivities in each adjacent layer, and the at least two heat source elements are patterned from the membrane material stack.

13. The device of claim 1, further comprising a thin insulating material on the top side or bottom side of the membrane.

14. The device of claim 1 comprising a temperature sense element patterned on the top side of the membrane.

15. The device of claim 1, wherein the membrane has a tensile stress profile that keeps the membrane pulled tightly across the frame.

16. A microscopic device comprising the device of claim 1 mounted in a manner which permits microscopic imaging of a specimen on the device wherein the conductive elements are coupled to a source of electricity.

17. A method of imaging a specimen at multiple temperatures and/or while changing temperatures using a microscopic device, the method comprising providing the device of claim 16 and controlling the temperature of the specimen during imaging.

18. An environmental cell comprising the device of claim 1 configured to permit control of:
  (a) heating of a specimen on the device; and
  (b) one or more other environmental conditions of the specimen on the device, wherein the one or more environmental conditions is selected from the group consisting of light, pressure, liquid content, and gas content.

19. The environmental cell of claim 18, comprising at least one temperature control device and/or at least one window device.

20. A method of detecting the pressure in the at least one membrane observation region of the device of claim 1, said method comprising:
  measuring the change in electrical resistance of the pressure sense element, wherein the change in electrical resistance is due to a deformation of the pressure sense element; and
  calculating the pressure from the measured change in electrical resistance,
  wherein the membrane observation region is deformed due to pressure and/or thermal expansion.

21. The method of claim 20, wherein the pressure sense element is a metal thin film resistor.

22. A device comprising:
  (c) a membrane comprising at least one membrane observation region, said membrane having a top side and a bottom side;
  (d) at least two conductive heat source elements in contact with the top side of the membrane;
  (c) a pressure sense element patterned directly across the top side of the membrane in the observation region,
wherein the membrane observation region is heatable, and wherein the at least two heat source elements are arranged so that current can be forced through the membrane thus allowing Joule heating to occur in the membrane observation region.

* * * * *